US012146905B2

(12) United States Patent
Jiang et al.

(10) Patent No.: US 12,146,905 B2
(45) Date of Patent: Nov. 19, 2024

(54) INSULATION RESISTOR DETECTION CIRCUIT, METHOD, AND APPARATUS, AND STORAGE MEDIUM THEREOF

(71) Applicant: Huawei Digital Power Technologies Co., Ltd., Guangdong (CN)

(72) Inventors: Jing Jiang, Shenzhen (CN); Zhiwei Wu, Shanghai (CN); Xiaopeng Zhao, Shanghai (CN); Wei Mo, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 170 days.

(21) Appl. No.: 18/069,427

(22) Filed: Dec. 21, 2022

(65) Prior Publication Data

US 2023/0128107 A1    Apr. 27, 2023

Related U.S. Application Data

(63) Continuation of application No. PCT/CN2020/099031, filed on Jun. 29, 2020.

(51) Int. Cl.
*G01R 31/14* (2006.01)
*G01R 31/00* (2006.01)

(52) U.S. Cl.
CPC .......... *G01R 31/14* (2013.01); *G01R 31/006* (2013.01)

(58) Field of Classification Search
CPC ............. G01R 31/005; G01R 31/006; G01R 31/1227; G01R 31/14; G01R 31/385; G01R 31/50; G01R 31/52; G01R 27/02; G01R 27/025; G01R 27/08; G01R 27/16; G01R 27/18; H02J 7/0029; H02J 7/00304; H02J 7/0036
See application file for complete search history.

(56) References Cited

U.S. PATENT DOCUMENTS

| 2018/0074113 A1* | 3/2018 | Sung | G01R 27/08 |
| 2019/0195931 A1* | 6/2019 | Kawamura | B60L 3/0069 |
| 2020/0292623 A1* | 9/2020 | Jang | G01R 27/18 |

* cited by examiner

*Primary Examiner* — Huy Q Phan
*Assistant Examiner* — David B Frederiksen
(74) *Attorney, Agent, or Firm* — HUAWEI TECHNOLOGIES CO., LTD.

(57) ABSTRACT

This application provides an insulation resistor detection circuit, which includes a state control unit, which is connected between a positive electrode and a negative electrode of a power supply of a to-be-detected apparatus; a first voltage division branch that is connected in parallel to a first capacitor to obtain a first voltage waveform, a second voltage division branch that is connected in parallel to a second capacitor to obtain a second voltage waveform; and a processor that is connected to the state control unit, the first voltage division branch, and the second voltage division branch; determines a next switching moment based on the first voltage waveform and the second voltage waveform that are at a current moment; and control, at the next switching moment, the state control unit to switch a state.

20 Claims, 11 Drawing Sheets

INSULATION RESISTOR DETECTION CIRCUIT, METHOD, AND APPARATUS, AND STORAGE MEDIUM THEREOF

CROSS REFERENCE OF RELATED APPLICATION

This application is a continuation of International Application No. PCT/CN2020/099031, filed on Jun. 29, 2020, the disclosure of which is hereby incorporated by reference in its entirety.

TECHNICAL FIELD

This application relates to the field of electric vehicle technologies, and in particular, to an insulation resistor detection circuit, method, and apparatus, and a storage medium thereof.

BACKGROUND

Compared with a conventional vehicle, a power supply voltage of a high-voltage power supply system of an electric vehicle is easily more than hundreds of volts (V). As the automotive industry develops rapidly and a large quantity of electric vehicles (EV) are used, detection of an insulation resistor in the high-voltage power supply system plays an irreplaceable role in vehicle safety and maintenance.

In the high-voltage power supply system, a voltage at a positive electrode of a power supply and a voltage at a negative electrode of the power supply are highest. Once an insulation resistor between the positive electrode of the power supply and the ground or an insulation resistor between the negative electrode of the power supply and the ground is faulty, a relatively large amount of current is leaked, and leakage occurs at a faulty location of the insulation resistor, which causes electric shock to a person when the leakage is severe. Therefore, detecting whether the insulation resistor in the high-voltage power supply system is faulty is mainly detecting the insulation resistor between the positive electrode of the power supply in the high-voltage power supply system and the ground and the insulation resistor between the negative electrode of the power supply and the ground. When a resistance value of any of the two insulation resistors is less than a requirement of the high-voltage power supply system for a resistance value of an insulation resistor, the power supply needs to be disconnected from a load in the high-voltage power supply system, to ensure safe running of the high-voltage power supply system.

In actual application, there are two manners of detecting an insulation resistor, where one is alternating-current signal injection method and the other one is external resistor connection method. The alternating-current signal injection method is to inject an alternating-current signal of a specific frequency between the positive electrode and the negative electrode of the power supply of the high-voltage power supply system, and obtain a resistance value of the insulation resistor in the high-voltage power supply system by measuring feedback of the high-voltage power supply system. However, when the detection manner is applied, the injected alternating-current signal is prone to cause interference to the high-voltage power supply system, which affects normal working of the system. The external resistor connection method is to connect a switch and a series of resistors between the positive electrode and the negative electrode of the power supply of the high-voltage power supply system, control on/off of the switch to obtain voltage values of the insulation resistor when the switch is in different states, list equations for a voltage change of the insulation resistor, and combine two equations to solve a value of the insulation resistor between the positive electrode of the power supply in the high-voltage power supply system and the ground and a value of the insulation resistor between the negative electrode and the ground, so as to determine a resistance value of the insulation resistor between the positive electrode of the power supply and the ground and a resistance value of the insulation resistor between the negative electrode and the ground.

In actual use, when the external resistor connection method is used to calculate the value of the insulation resistor between the positive electrode of the power supply and the ground and the value of the insulation resistor between the negative electrode and the ground, the switch is turned off or turned on based on a fixed period. When the insulation resistor between the positive electrode of the power supply and the ground and the insulation resistor between the negative electrode and the ground are faulty, the insulation resistor is still detected based on a fixed period. As a result, the high-voltage power supply system cannot detect a fault of the insulation resistor in time. Therefore, when the insulation resistor is faulty and cannot meet an insulation requirement of the high-voltage power supply system, the foregoing detection method cannot be used for fault alarming or processing in time, which affects safe running of the high-voltage power supply system, and may even cause electric shock to a person in a severe case.

Therefore, the existing insulation resistor detection manner cannot detect a fault of an insulation resistor in time, which affects safe running of the high-voltage power supply system.

SUMMARY

This application provides an insulation resistor detection circuit, method, and apparatus, and a storage medium thereof, to quickly detect whether an insulation resistor is faulty, thereby ensuring safe running of a high-voltage power supply system.

According to a first aspect, an embodiment of this application provides an insulation resistor detection circuit. The insulation resistor detection circuit may be connected to a to-be-detected apparatus, and is configured to detect an insulation resistor between a positive electrode and a negative electrode of a power supply of the to-be-detected apparatus, and determine whether an insulation failure occurs in the to-be-detected apparatus. Specifically, the insulation resistor detection circuit may include a state control unit, a first voltage division branch, a second voltage division branch, and a processor.

The state control unit is connected between the positive electrode and the negative electrode of the power supply of the to-be-detected apparatus, and the processor is separately connected to the state control unit, the first voltage division branch, and the second voltage division branch.

The state control unit is configured to switch between a first state and a second state under control of the processor. When the state control unit is in the first state, a first capacitor is charged and a second capacitor discharges electricity; and when the state control unit is in the second state, the first capacitor discharges electricity and the second capacitor is charged. The first capacitor is a capacitor between the positive electrode of the power supply and the ground, and the second capacitor is a capacitor between the negative electrode of the power supply and the ground. The first voltage division branch is configured to be connected in parallel to the first capacitor, and is configured to divide voltages at two ends of the first capacitor to obtain a first voltage waveform. The second voltage division branch is configured to be connected in parallel to the second capacitor, and is configured to divide voltages at two ends of the second capacitor to obtain a second voltage waveform. The processor is configured to: calculate, based on the first voltage waveform obtained at a current moment, voltage feature values of the first capacitor at different moments in specified duration before the current moment; calculate, based on the second voltage waveform obtained at the current moment, voltage feature values of the second capacitor at different moments in the specified duration before the current moment; determine a next switching moment of the state control unit based on the voltage feature values of the first capacitor at the different moments and/or the voltage feature values of the second capacitor at the different moments; and control, when the next switching moment arrives, the state control unit to switch a state.

According to the foregoing circuit structure, the state control unit is controlled to switch between the first state and the second state, to control the first capacitor and the second capacitor to be charged and discharge electricity. In a process of charging the first capacitor and the second capacitor, if the insulation resistor between the positive electrode and the negative electrode of the power supply remains unchanged, the first voltage waveform and the second voltage waveform change according to a specified rule; or if the insulation resistor between the positive electrode and the negative electrode of the power supply changes, change rules of the first voltage waveform and the second voltage waveform change. Therefore, voltage feature values of the first capacitor at different moments and/or voltage feature values of the second capacitor at different moments may be calculated to detect, in time, whether the insulation resistor changes. When it is determined that the insulation resistor changes, a switching moment is changed, to obtain, as soon as possible, a waveform corresponding to insulation resistor at the current moment to calculate a resistance value of the insulation resistor. Therefore, when it is detected that the resistance value of the insulation resistor does not meet a requirement, the to-be-detected apparatus is protected quickly.

In a possible design, the processor is further configured to determine a resistance value of a first resistor and a resistance value of a second resistor based on the first voltage waveform and the second voltage waveform that are respectively obtained in the first state and the second state after the next switching moment arrives, where the first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether an insulation resistor is faulty.

According to the foregoing circuit structure, the resistance value of the first resistor and the resistance value of the second resistor may be calculated based on the first voltage waveform and the second voltage waveform that currently correspond to the insulation resistor when the state control unit is in the first state and the second state after the next switching moment arrives, and the resistance value of the first resistor and the resistance value of the second resistor are used to accurately determine whether an insulation failure occurs in the to-be-detected apparatus.

In a possible design, the state control unit includes a first switch unit and a second switch unit.

A first end of the first switch unit is connected to the positive electrode of the power supply, and a second end of the first switch unit is connected to the ground. A first end of the second switch unit is connected to the negative electrode of the power supply, and a second end of the second switch unit is connected to the ground. When the first switch unit is turned on and the second switch unit is turned off, the state control unit is in the first state; and when the first switch unit is turned off and the second switch unit is turned on, the state control unit is in the second state.

According to the foregoing circuit structure, working statuses of the first switch unit and the second switch unit may be controlled to separately control charging or discharging of the first capacitor and the second capacitor, thereby precisely controlling the state control unit to switch between the first state and the second state.

In a possible design, the first switch unit includes a first switch and a third resistor.

A first end of the third resistor is connected to the positive electrode of the power supply, and a second end of the third resistor is connected to a first end of the first switch. A second end of the first switch is connected to the ground, and a control end of the first switch is connected to the processor.

According to the foregoing circuit structure, a working status of the first switch may be controlled to control a charging/discharging moment of the first capacitor, and the third resistor is used for current limiting, to prevent the first switch from causing a short circuit between the positive electrode of the power supply and the ground.

In a possible design, the second switch unit includes a second switch and a fourth resistor.

A first end of the second switch is connected to the ground, a second end of the second switch is connected to a first end of the fourth resistor, and a control end of the second switch is connected to the processor. A second end of the fourth resistor is connected to the negative electrode of the power supply.

According to the foregoing circuit structure, a working status of the second switch may be controlled to control a charging/discharging moment of the second capacitor, and the fourth resistor is used for current limiting, to prevent the second switch from causing a short circuit between the negative electrode of the power supply and the ground.

In a possible design, the first voltage division branch may include a fifth resistor and a sixth resistor.

Specifically, a first end of the fifth resistor is connected to the positive electrode of the power supply, and a second end of the fifth resistor is separately connected to a first end of the sixth resistor and the processor. A second end of the sixth resistor is connected to the ground and the processor.

According to the foregoing circuit structure, because a voltage between the positive electrode of the power supply of the to-be-detected apparatus and the ground is relatively high, to ensure detection accuracy and detection costs, two resistors may be disposed on the first voltage division branch, and first voltages at two ends of a resistor with a relatively small resistance value may be obtained for detection, so that when the first voltage fluctuates, the fluctuation can be detected accurately, thereby ensuring detection accuracy.

In a possible design, the second voltage division branch may include a seventh resistor and an eighth resistor.

Specifically, a first end of the seventh resistor is connected to the ground and the processor, and a second end of the seventh resistor is separately connected to a first end of the eighth resistor and the processor. A second end of the eighth resistor is connected to the negative electrode of the power supply.

According to the foregoing circuit structure, because a voltage between the negative electrode of the power supply of the to-be-detected apparatus and the ground is relatively high, to ensure detection accuracy and detection costs, two resistors may be disposed on the second voltage division branch, and second voltages at two ends of a resistor with a relatively small resistance value may be obtained for detection, so that when the second voltage fluctuates, the fluctuation can be detected accurately, thereby ensuring detection accuracy.

In a possible design, the insulation resistor detection circuit provided in this embodiment of this application further includes a ninth resistor and a third switch.

A first end of the ninth resistor is separately connected to the positive electrode of the power supply and the processor, a second end of the ninth resistor is separately connected to a first end of the third switch and the processor, and a resistance value of the ninth resistor is less than a preset threshold. A second end of the third switch is connected to the ground, and a control end of the third switch is connected to the processor.

Specifically, the processor is further configured to: control the third switch to be turned on and turned off, and calculate a parallel resistance value of the first resistor and the second resistor based on the first voltage waveform obtained on the first voltage division branch and the second voltage waveform obtained on the second voltage division branch in specific duration after the next switching moment arrives and voltage waveforms obtained at two ends of the ninth resistor when the third switch is turned on, where the parallel resistance value is used to determine whether an insulation resistor is faulty.

According to the foregoing circuit structure, because the first resistor and the second resistor are connected in series between the positive electrode and the negative electrode of the power supply of the to-be-detected apparatus, when any of the first resistor and the second resistor is faulty, safe running of the to-be-detected apparatus is affected. Therefore, parallel resistance of the first resistor and the second resistor may be detected to determine whether an insulation failure occurs in the to-be-detected apparatus. Because the resistance value of the first resistor and the resistance value of the second resistor do not need to be calculated, a calculation amount of the processor is reduced.

According to a second aspect, an embodiment of this application provides a high-voltage system monitoring apparatus, and the high-voltage system monitoring apparatus may be connected to a high-voltage system to monitor a working status of the high-voltage system. Specifically, the monitoring apparatus may include a switch module, an alarming module, a communications module, and the insulation resistor detection circuit provided in the first aspect of the embodiments of this application.

The insulation resistor detection circuit is connected to the communications module, and the communications module is connected to the alarming module.

The switch module is configured to be connected between a power supply and a load that are of the high-voltage system. The insulation resistor detection circuit is configured to: detect a resistance value of a first resistor between a positive electrode of the power supply and the ground and a resistance value of a second resistor between a negative electrode of the power supply and the ground, and send the resistance value of the first resistor and the resistance value of the second resistor to the communications module. The communications module is configured to: when determining that the resistance value of the first resistor or the resistance value of the second resistor is less than a first preset resistance threshold, instruct the alarming module to perform alarming; and when the resistance value of the first resistor or the resistance value of the second resistor is less than a second preset resistance threshold, control the switch module to be turned off.

According to the foregoing apparatus structure, whether an insulation resistor in the high-voltage system changes can be detected in time, and when it is determined that the insulation resistor changes, the alarming module performs alarming to prompt an employee to replace the first resistor and the second resistor, to ensure safe running of the high-voltage system.

According to a third aspect, an embodiment of this application provides an insulation resistor detection method. The method may be performed by the processor in the insulation resistor detection circuit provided in the first aspect of the embodiments or another processor communicatively connected to a to-be-detected apparatus. The method specifically includes the following steps: obtaining a first voltage waveform corresponding to a first capacitor and a second voltage waveform corresponding to a second capacitor, where the first capacitor is a capacitor between a positive electrode of a power supply of a to-be-detected apparatus and the ground, and the second capacitor is a capacitor between a negative electrode of the power supply and the ground; controlling the first capacitor and the second capacitor to switch between a first state and a second state, where the first state is that the first capacitor is charged and the second capacitor discharges electricity, and the second state is that the first capacitor discharges electricity and the second capacitor is charged; calculating, based on the first voltage waveform obtained at a current moment, voltage feature values of the first capacitor at different moments in specified duration before the current moment; and calculating, based on the second voltage waveform obtained at the current moment, voltage feature values of the second capacitor at different moments in the specified duration before the current moment; determining a next switching moment based on the voltage feature values of the first capacitor at the different moments and/or the voltage feature values of the second capacitor at the different moments; and controlling, when the next switching moment arrives, the first capacitor and the second capacitor to switch a state.

According to the foregoing method, voltage feature values of the first capacitor at different moments and voltage feature values of the second capacitor at different moments may be used to determine whether a resistance value of an insulation resistor in the to-be-detected apparatus changes, and adjust state switching moments of the first capacitor and the second capacitor. Because the first voltage waveform and the second voltage waveform that correspond to the insulation resistor need to be obtained when the resistance value of the insulation resistor in the to-be-detected apparatus is calculated, a voltage waveform corresponding to the resistance value of the insulation resistor may be obtained as soon as possible by using the foregoing method when the resistance value of the insulation resistor changes. Therefore, it is ensured that when the resistance value of the insulation resistor changes, it is detected, as soon as possible, whether a current resistance value of the insulation resistor meets an insulation requirement of the to-be-detected apparatus, to determine whether an insulation failure occurs in the to-be-detected apparatus.

In a possible design, after the controlling, when the next switching moment arrives, the first capacitor and the second capacitor to switch a state, the method further includes:

continuing to obtain the first voltage waveform and the second voltage waveform; and determining a resistance value of a first resistor and a resistance value of a second resistor based on the continuously obtained first voltage waveform and second voltage waveform, where the first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether an insulation resistor is faulty.

According to the foregoing method, after the first capacitor and the second state are switched to the second state at the next switching moment, the first voltage waveform that correspond to the first resistor at the current moment, and the second voltage waveform that correspond to the resistance value of the second resistor at the current moment are obtained, the resistance value of the first resistor may be accurately calculated by using the first voltage waveform, and the resistance value of the second resistor may be accurately calculated by using the second voltage waveform.

In a possible design, the determining a next switching moment of the first capacitor and the second capacitor based on the voltage feature values of the first capacitor at the different moments and/or the voltage feature values of the second capacitor at the different moments includes:

comparing any two adjacent voltage feature values in the voltage feature values of the first capacitor at the different moments, and/or comparing any two adjacent voltage feature values in the voltage feature values of the second capacitor at the different moments; and when determining that a difference between any two adjacent voltage feature values is greater than a preset error threshold, determining the current moment as the next switching moment; and when determining that a difference between any two adjacent voltage feature values is less than or equal to the preset error threshold, determining a time constant of the first capacitor and/or a time constant of the second capacitor, and determining the next switching moment based on the time constant of the first capacitor and/or the time constant of the second capacitor.

According to the foregoing method, the first capacitor and the second capacitor are respectively charged and discharge electricity by using the first resistor and the second resistor. Therefore, when the resistance value of the first resistor and the resistance value of the second resistor remain unchanged, the first voltage waveform and the second voltage waveform change according to a fixed rule, two adjacent feature values in the calculated voltage feature values of the first capacitor at the different moments are equal or similar to each other, and/or two adjacent feature values in the calculated voltage feature values of the second capacitor at the different moments are equal or similar to each other. When it is detected that a difference between two adjacent voltage feature values in the voltage feature values of the first capacitor at the different moments is greater than the preset error threshold, and/or a difference between two adjacent voltage feature values in the voltage feature values of the second capacitor at the different moments is greater than the preset error threshold, it may be determined that the resistance value of the first resistor and/or the resistance value of the second resistor change/changes at the current moment, and a state of the first capacitor and a state of the second capacitor are immediately switched, to obtain, as soon as possible, a voltage waveform corresponding to the resistance value of the first resistor and/or a voltage waveform corresponding to the resistance value of the second resistor after the resistance value of the first resistor and/or the resistance value of the second resistor change/changes after the next switching moment.

In a possible design, the determining a resistance value of a first resistor and a resistance value of a second resistor based on the continuously obtained first voltage waveform and second voltage waveform includes:

when determining that a difference between any two adjacent voltage feature values is less than or equal to the preset error threshold, recording a first voltage value and a second voltage value that respectively correspond to the first voltage waveform and the second voltage waveform at each switching moment of the first capacitor and the second capacitor; when determining that a difference between any two adjacent voltage feature values is greater than the preset error threshold, deleting a first voltage value and a second voltage value that are recorded before the current moment, and re-recording a first voltage value and a second voltage value that respectively correspond to the first voltage waveform and the second voltage waveform at each subsequent switching moment of the first capacitor and the second capacitor; and determining the resistance value of the first resistor and the resistance value of the second resistor by using the recorded first voltage value and second voltage value.

According to the foregoing method, in a charging process or a discharging process of the first capacitor connected to the first resistor and that of the second capacitor connected to the second resistor, voltages at two ends meet a relationship equation commonly used for capacitor charging/discharging. Therefore, the first voltage value and the second voltage value at a switching moment may be recorded, and the resistance value of the first resistor and the resistance value of the second resistor may be accurately calculated by using the recorded first voltage value and second voltage value.

In a possible design, the insulation resistor detection method provided in this embodiment of this application further includes:

sending a turn-off instruction to the to-be-detected apparatus when determining that the resistance value of the first resistor or the resistance value of the second resistor is less than a first preset insulation threshold, where the turn-off instruction is used to instruct the to-be-detected apparatus to disconnect the power supply from a load.

According to the foregoing method, it may be detected whether the resistance value of the first resistor and the resistance value of the second resistor meet an insulation requirement of the to-be-detected apparatus. When the resistance value of any of the first resistor and the second resistor does not meet the insulation requirement, the power supply of the to-be-detected apparatus is disconnected from the load, to ensure avoidance of an electric shock phenomenon.

In a possible design, after the continuing to obtain the first voltage waveform and the second voltage waveform, the insulation resistor detection method provided in this embodiment of this application further includes:

determining a parallel resistance value of the first resistor and the second resistor based on the continuously obtained first voltage waveform and second voltage waveform; and sending a turn-off instruction to the to-be-detected apparatus when determining that the parallel resistance value is less than a second preset insulation threshold, where the turn-off instruction is used to instruct the to-be-detected apparatus to disconnect the power supply from a load.

According to the foregoing method, the first resistor is connected in parallel to the first capacitor, the second resistor is connected in parallel to the second capacitor, and the first resistor and the second resistor are connected in series between the positive electrode and the negative electrode of the power supply of the to-be-detected apparatus. Because a voltage between the positive electrode of the power supply of the to-be-detected apparatus and the ground and a voltage between the negative electrode and the ground are relatively high, when any of the first resistor and the second resistor is faulty, safe running of the to-be-detected apparatus is affected. Therefore, accurate resistance values of the first resistor and the second resistor may not need to be calculated, and the parallel resistance value of the first resistor and the second resistor may be calculated to determine whether an insulation fault occurs in the to-be-detected apparatus.

In a possible design, the voltage feature value of the first capacitor includes one or more of the following: the time constant of the first capacitor or a voltage waveform status of the first capacitor; the voltage feature value of the second capacitor includes one or more of the following:

the time constant of the second capacitor and a voltage waveform status of the second capacitor; the voltage waveform status of the first capacitor represents fluctuation trends of voltages at two ends of the first capacitor; and the voltage waveform status of the second capacitor represents fluctuation trends of voltages at two ends of the second capacitor.

According to a fourth aspect, an embodiment of this application provides an insulation resistor detection apparatus, where the insulation resistor detection apparatus includes an obtaining unit, a processing unit, and a calculation unit.

The obtaining unit may be configured to obtain a first voltage waveform corresponding to a first capacitor and a second voltage waveform corresponding to a second capacitor, where the first capacitor is a capacitor between a positive electrode of power supply of a to-be-detected apparatus and the ground, and the second capacitor is a capacitor between a negative electrode of the power supply and the ground. The processing unit may be configured to control the first capacitor and the second capacitor to switch between a first state and a second state, where the first state is that the first capacitor is charged and the second capacitor discharges electricity, and the second state is that the first capacitor discharges electricity and the second capacitor is charged. The calculation unit is configured to: calculate, based on the first voltage waveform obtained at a current moment, voltage feature values of the first capacitor at different moments in specified duration before the current moment; and calculate, based on the second voltage waveform obtained at the current moment, voltage feature values of the second capacitor at different moments in the specified duration before the current moment. The processing unit is further configured to: determine a next switching moment based on the voltage feature values of the first capacitor that are output by the calculation unit at the different moments and/or the voltage feature values of the second capacitor that are output by the calculation unit at the different moments; and control, when the next switching moment arrives, the first capacitor and the second capacitor to switch a state.

In a possible design, the obtaining unit is further configured to: after the first capacitor and the second capacitor are controlled to switch a state when the next switching moment arrives, continue to obtain the first voltage waveform and the second voltage waveform. The processing unit is further configured to determine a resistance value of a first resistor and a resistance value of a second resistor based on the first voltage waveform and the second voltage waveform that are continuously obtained by the obtaining unit. The first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether an insulation resistor is faulty.

In a possible design, the processing unit is specifically configured to: compare any two adjacent voltage feature values in the voltage feature values of the first capacitor at the different moments, and/or compare any two adjacent voltage feature values in the voltage feature values of the second capacitor at the different moments; when determining that a difference between any two adjacent voltage feature values is greater than a preset error threshold, determine the current moment as the next switching moment; and when determining that a difference between any two adjacent voltage feature values is less than or equal to the preset error threshold, determine a time constant of the first capacitor and/or a time constant of the second capacitor, and determine the next switching moment based on the time constant of the first capacitor and/or the time constant of the second capacitor.

In a possible design, the processing unit is specifically configured to: when determining that a difference between any two adjacent voltage feature values is less than or equal to the preset error threshold, record a first voltage value and a second voltage value that respectively correspond to the first voltage waveform and the second voltage waveform at each switching moment of the first capacitor and the second capacitor; when determining that a difference between any two adjacent voltage feature values is greater than the preset error threshold, delete a first voltage value and a second voltage value that are recorded before the current moment, and re-record a first voltage value and a second voltage value that respectively correspond to the first voltage waveform and the second voltage waveform at each subsequent switching moment of the first capacitor and the second capacitor; and determine the resistance value of the first resistor and the resistance value of the second resistor by using the recorded first voltage value and second voltage value.

In a possible design, the processing unit is further configured to send a turn-off instruction to the to-be-detected apparatus when determining that the resistance value of the first resistor or the resistance value of the second resistor is less than a first preset insulation threshold, where the turn-off instruction is used to instruct the to-be-detected apparatus to disconnect the power supply from a load.

In a possible design, the processing unit is further configured to: determine a parallel resistance value of the first resistor and the second resistor based on the continuously obtained first voltage waveform and second voltage waveform; and send a turn-off instruction to the to-be-detected apparatus when determining that the parallel resistance value is less than a second preset insulation threshold, where the turn-off instruction is used to instruct the to-be-detected apparatus to disconnect the power supply from a load.

In a possible design, the voltage feature value of the first capacitor includes one or more of the following: the time constant of the first capacitor and a voltage waveform status of the first capacitor; the voltage feature value of the second capacitor includes one or more of the following: the time constant of the second capacitor and a voltage waveform status of the second capacitor; the voltage waveform status of the first capacitor represents fluctuation trends of voltages at two ends of the first capacitor; and the voltage waveform status of the second capacitor represents fluctuation trends of voltages at two ends of the second capacitor.

According to a fifth aspect, an embodiment of this application further provides a computer-readable storage medium, where the computer-readable storage medium stores computer-readable instructions. When the computer-readable instructions are run on a computer, the method according to any one of the third aspect or the possible designs of the third aspect is performed.

DESCRIPTION OF EMBODIMENTS

Figure 1:
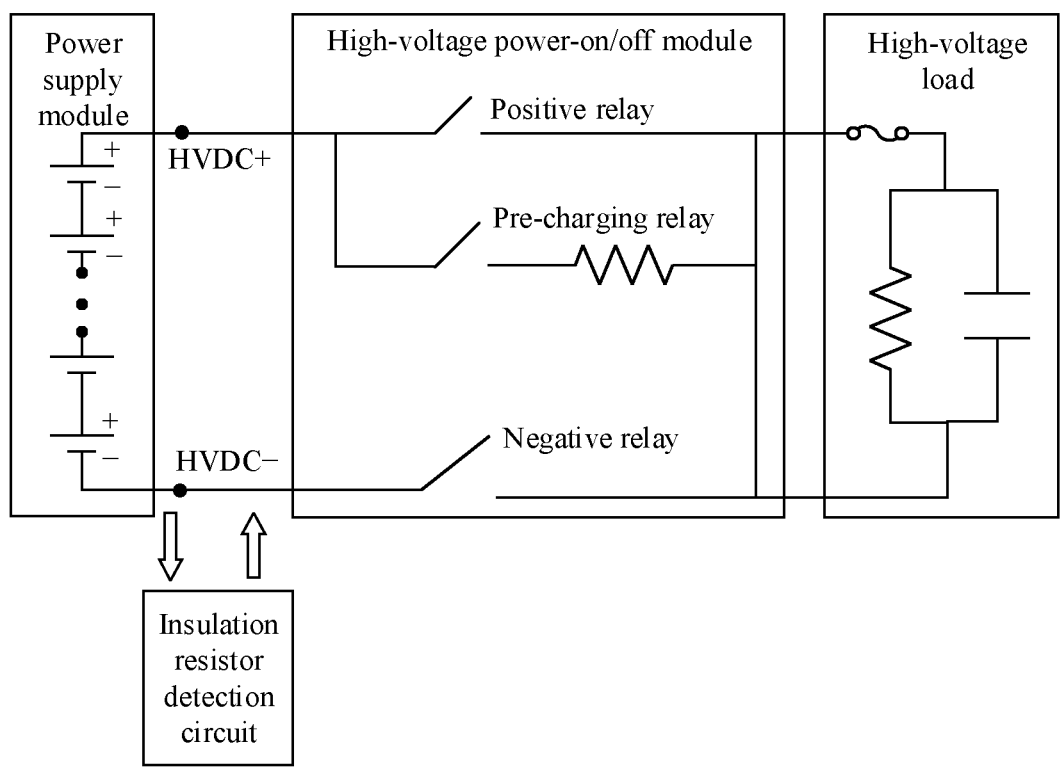
FIG. 1 is a schematic diagram of a structure of an application scenario of an insulation resistor detection apparatus according to this application.

Embodiments of this application provide an insulation resistor detection circuit, method, and apparatus, and a storage medium thereof. The method and the apparatus are based on a same technical concept. Because a problem-resolving principle of the method is similar to that of the apparatus, mutual reference may be made to implementations of the apparatus and the method. Repeated parts are not described in detail again.

It should be noted that "and/or" in descriptions of embodiments of this application describes only an association relationship for describing associated objects and represents that three relationships may exist. For example, A and/or B may represent the following three cases: Only A exists, both A and B exist, and only B exists. "Connection" describes a connection relationship between two objects, and may represent two connection relationships. For example, that A and B are connected may represent two cases: A is directly connected to B, and A is connected to B by using C. The character "/" generally indicates an "or" relationship between the associated objects. In this application, "at least one" means one or more, and "a plurality of" means two or more. In addition, it should be understood that, in descriptions of this application, the terms such as "first", "second", and "third" are merely used for differentiation and description, but cannot be understood as an indication or implication of relative importance or an indication or implication of an order. Reference to "an embodiment", "some embodiments", or the like described in this specification indicates that one or more embodiments of this application include a specific feature, structure, or characteristic described with reference to the embodiments. Therefore, in this specification, statements, such as "in an embodiment", "in some embodiments", "in some other embodiments", and "in other embodiments", that appear at different places do not necessarily mean referring to a same embodiment. Instead, the statements mean "one or more but not all of the embodiments", unless otherwise specifically emphasized in another manner. The terms "include", "have", and variants of the terms all mean "include but are not limited to", unless otherwise specifically emphasized in another manner. In a formula in the embodiments of this application, multiplication may be represented by "*" or may be represented by "x", and a parallel connection may be represented by "||".

The insulation resistor detection circuit, method, and apparatus, and the storage medium thereof that are provided in the embodiments of this application may be applied to an electric vehicle, a numerical control machine tool, a wind power generation system, a photovoltaic power generation system, and another apparatus to which power is supplied with a high voltage, to detect whether an insulation resistor between a positive electrode and a negative electrode of a power supply in a to-be-detected apparatus fails.

The following describes in detail the embodiments of this application with reference to the accompanying drawings.

FIG. 1 shows an example of an application scenario of an electric vehicle. As shown in FIG. 1, the electric vehicle includes at least a power supply module, a high-voltage power-on/off module, and a high-voltage load. The power supply module includes a plurality of battery groups to supply power to the high-voltage load, and the high-voltage power-on/off module is configured to control connection between the power supply module and the high-voltage load. The insulation resistor detection circuit provided in the embodiments of this application may be connected between a positive electrode output end HVDC+ and a negative electrode output end HVDC− of a power supply of the power supply module, and is configured to detect whether an insulation resistor between a positive electrode and a negative electrode of the power supply module fails.

Figure 2:
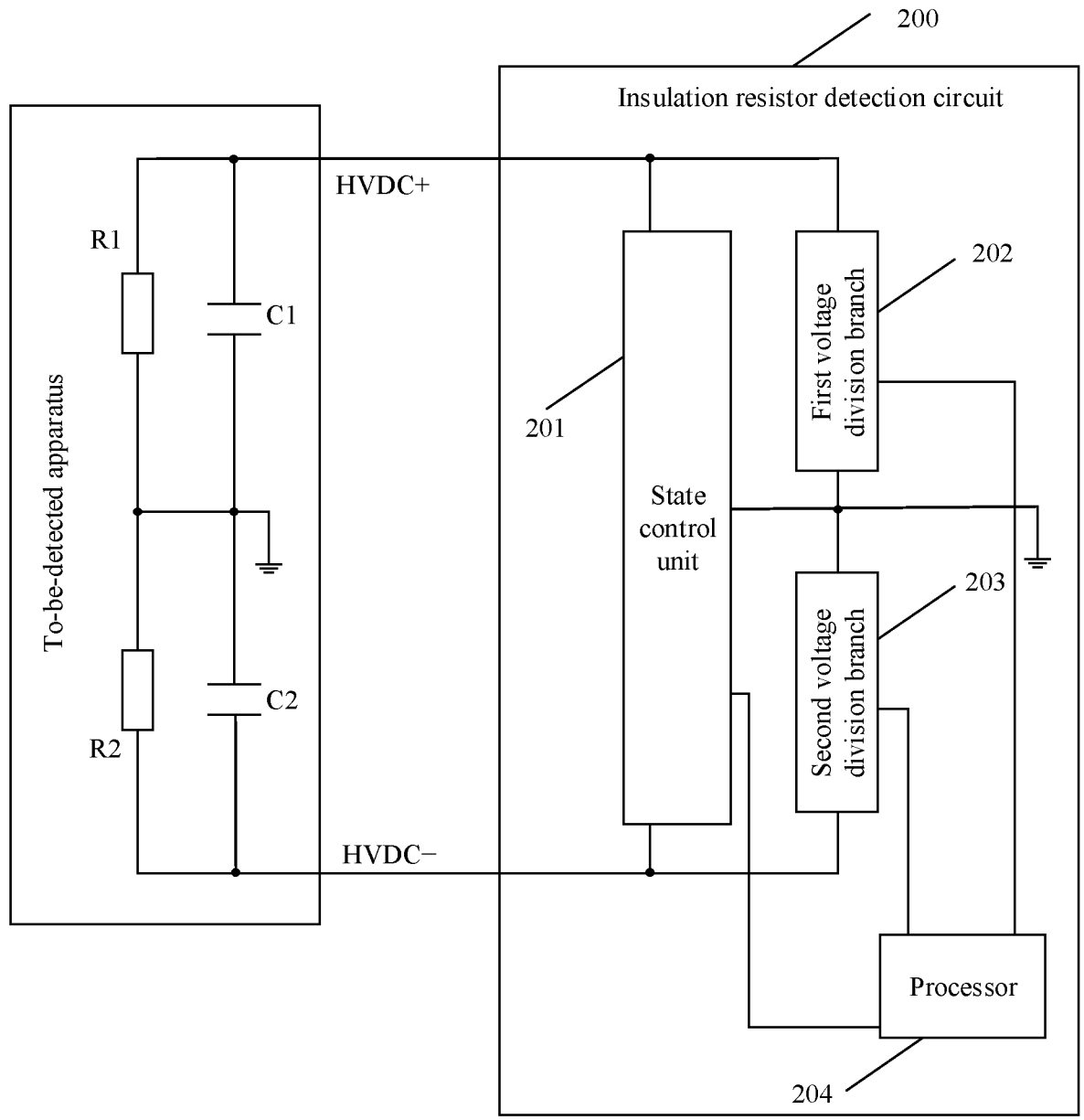
FIG. 2 is a schematic diagram of a structure of an insulation resistor detection circuit according to an embodiment of this application.

FIG. 2 is a schematic diagram of a structure of an insulation resistor detection circuit 200 according to this application. The insulation resistor detection circuit 200 may be connected to a positive electrode of a power supply of a to-be-detected apparatus and a negative electrode of the power supply, and is configured to quickly and accurately detect a resistance value of an insulation resistor between the positive electrode of the power supply of the to-be-detected apparatus and the ground and a resistance value of an insulation resistor between the negative electrode of the power supply and the ground, and determine, based on the detected resistance values of the insulation resistors, whether an insulation fault occurs between the positive electrode of the power supply of the to-be-detected apparatus and the negative electrode of the power supply.

Specifically, the insulation resistor detection circuit 200 may include a state control unit 201, a first voltage division branch 202, a second voltage division branch 203, and a processor 204.

The state control unit 201 is connected between a positive electrode HVDC+ of a power supply of a to-be-detected apparatus and a negative electrode HVDC− of the power supply. The processor 204 is separately connected to the state control unit 201, the first voltage division branch 202, and the second voltage division branch 203.

The state control unit 201 switches between a first state and a second state under control of the processor 204. When the state control unit 204 is in the first state, a first capacitor C1 is charged and a second capacitor C2 discharges electricity; and when the state control unit 201 is in the second state, the first capacitor C1 discharges electricity and the second capacitor C2 is charged. The first capacitor C1 is a capacitor between the positive electrode of the power supply and the ground, and the second capacitor C2 is a capacitor between the negative electrode of the power supply and the ground. The first voltage division branch 202 is configured to be connected in parallel to the first capacitor C1, and is configured to divide voltages at two ends of the first capacitor C1 to obtain a first voltage waveform. The second voltage division branch 203 is configured to be connected in parallel to the second capacitor C2, and is configured to divide voltages at two ends of the second capacitor C2 to obtain a second voltage waveform. The processor 204 is configured to: calculate, based on the first voltage waveform obtained at a current moment, voltage feature values of the first capacitor at different moments in specified duration before the current moment; calculate, based on the second voltage waveform obtained at the current moment, voltage feature values of the second capacitor at different moments in the specified duration before the current moment; determine a next switching moment based on the voltage feature values of the first capacitor at the different moments and/or the voltage feature values of the second capacitor at the different moments; and control, when the next switching moment arrives, the state control unit 201 to switch a state.

Further, after controlling, when the next switching moment arrives, the state control unit 201 to switch a state, the processor 204 determines a resistance value of a first resistor R1 and a resistance value of a second resistor R2 based on the first voltage waveform obtained on the first voltage division branch 202 and the second voltage waveform obtained on the second voltage division branch 203 when the state control unit 201 is subsequently in the first state and the second state. The first resistor R1 is an insulation resistor between the positive electrode of the power supply and the ground, the second resistor R2 is an insulation resistor between the negative electrode of the power supply and the ground, and the resistance value of the first resistor R1 and the resistance value of the second resistor R2 are used to determine whether an insulation resistor in the to-be-detected apparatus is faulty and whether an insulation fault occurs.

It should be understood that the first capacitor C1 is connected in parallel to the first voltage division branch 202. Therefore, the first voltage waveform on the first voltage division branch 202 may be detected to determine voltage change statuses at the two ends of the first capacitor C1. Similarly, the second voltage waveform on the second voltage division branch 203 may be detected to determine voltage change statuses at the two ends of the second capacitor C2.

In actual use, the state control unit 201 controls a charging process and a discharging process of the first capacitor C1 and the second capacitor C2. If the resistance value of the first resistor R1 and the resistance value of the second resistor R2 remain unchanged, the obtained first voltage waveform and the obtained second voltage waveform change according to a fixed rule, and voltage feature values of the first capacitor that are obtained at different moments and/or voltage feature values of the second capacitor that are obtained at different moments are equal or similar to each other. If the resistance value of the first resistor R1 and the resistance value of the second resistor R2 change in the charging process and the discharging process of the first capacitor and the second capacitor, change rules of the first voltage waveform and the second voltage waveform change at a moment at which the resistance value of the first resistor R1 and the resistance value of the second resistor R2 change. Therefore, the voltage feature value that is of the first capacitor and that represents a change rule of the first voltage waveform and/or the voltage feature value that is of the second capacitor and that represents a change rule of the second voltage waveform may be detected to determine whether a current resistance value of the first resistor R1 and a current resistance value of the second resistor R2 change, and a state switching moment of the state control unit 201 is adjusted based on a change status of the resistance value of the first resistor R1 and a change status of the resistance value of the second resistor R2, so as to obtain, as soon as possible, a first voltage waveform and a second voltage waveform that correspond to each of the current resistance value of the first resistor R1 and the current resistance value of the second resistor R2, to accurately calculate the resistance value of the first resistor R1 and the resistance value of the second resistor R2, and determine whether an insulation fault occurs in the to-be-detected apparatus.

It should be understood that, because the first capacitor C1 and the second capacitor C2 are connected in series between the positive electrode HVDC+ and the negative electrode HVDC− of the power supply, when the first resistor R1 connected in parallel to the first capacitor C1 changes, the voltages at the two ends of the first capacitor C1 change. However, a voltage value between the positive electrode HVDC+ and the negative electrode HVDC− of the power supply remains unchanged, and therefore the voltages at the two ends of the second capacitor C2 also change correspondingly. Therefore, voltage feature values of the first capacitor C1 at different moments or voltage feature values of the second capacitor C2 at different moments may be detected to determine whether the resistance value of the first resistor R1 and the resistance value of the second resistor R2 change.

In another example, due to a reason such as a detection error, an error is allowed between the detected voltage feature values of the first capacitor C1 at the different moments. To avoid the detection error, the voltage feature values of the first capacitor C1 at the different moments and the voltage feature values of the second capacitor C2 at the different moments may be simultaneously detected to accurately determine whether the resistance value of the first resistor R1 and the resistance value of the second resistor R2 change, so as to accurately determine the next switching moment. The voltage feature value of the first capacitor C1 may be but is not limited to a time constant of the first capacitor and/or a voltage waveform status of the first capacitor. The voltage feature value of the second capacitor may be but is not limited to a time constant of the second capacitor and/or a voltage waveform status of the second capacitor. The voltage waveform status of the first capacitor represents fluctuation trends of the voltages at the two ends of the first capacitor, and the voltage waveform status of the second capacitor represents fluctuation trends at the two ends of the second capacitor.

Further, a direction of the first voltage waveform is the same as a direction of the second voltage waveform. That the direction of the first voltage waveform is the same as the direction of the second voltage waveform may specifically mean the following: When the first voltage division branch 202 outputs the first voltage waveform, an end outputting a high potential is connected to an end that is of the processor 204 and that receives a high potential, and an end outputting a low potential is connected to an end that is of the processor 204 and that receives a low potential, where a difference between the high potential and the low potential is equal to a first voltage. When the second voltage division branch 203 outputs the second voltage waveform, an end outputting a high potential is connected to the end that is of the processor 204 and that receives a high potential, and an end outputting a low potential is connected to the end that is of the processor 204 and that receives a low potential, where a difference between the high potential and the low potential is a second voltage.

In this application, the processor 204 may be used to implement switching of the state control unit 201 between the first state and the second state.

Specifically, the processor 204 may send a control signal to the state control unit 201, to control the state control unit 201 to be in the first state or the second state. The first state may be but is not limited to: the first capacitor C1 is charged and the second capacitor C2 discharges electricity. The second state may be but is not limited to: the first capacitor C1 discharges electricity and the second capacitor C2 is charged.

In actual application, a fixed interface may be disposed on the to-be-detected apparatus, and the insulation resistor detection circuit 200 may be connected to the to-be-detected apparatus by using the fixed interface, to detect the resistance value of the first resistor R1 and the resistance value of the second resistor R2.

In specific implementation, the processor 204 may be connected to the state control unit 201 and send the control signal to the state control unit 201. After the state control unit 201 receives the control signal, the state control unit 201 is controlled in response to the control signal to switch between the first state and the second state.

In specific implementation, the processor 204 may be any one of a micro control unit (MCU), a central processing unit (CPU), or a digital signal processor (DSP). Certainly, a specific form of the processor is not limited to the foregoing examples.

The following describes specific structures of the state control unit 201, the first voltage division branch 202, the second voltage division branch 203, and the processor 204 in the insulation resistor detection circuit 200.

I. State Control Unit 201

The state control unit 201 is connected between a positive electrode and a negative electrode of a power supply of a to-be-detected apparatus, and the state control unit 201 may be configured to switch between a first state and a second state under control of the processor 204. When the state control unit 201 is in the first state, a first capacitor C1 is charged and a second capacitor C2 discharges electricity; and when the state control unit 201 is in the second state, the first capacitor C1 discharges electricity and the second capacitor C2 is charged. The first capacitor C1 is a capacitor between the positive electrode of the power supply and the ground, and the second capacitor C2 is a capacitor between the negative electrode of the power supply and the ground.

The state control unit 201 may include a first switch unit and a second switch unit.

Specifically, a first end of the first switch unit is connected to the positive electrode of the power supply, and a second end of the first switch unit is connected to the ground. A first end of the second switch unit is connected to the negative electrode of the power supply, and a second end of the second switch unit is connected to the ground. When the first switch unit is turned on and the second switch unit is turned off, the state control unit 201 is in the first state. When the first switch unit is turned off and the second switch unit is turned on, the state control unit 201 is in the second state.

A function of disposing the first switch unit is to control, through on and off of the first switch unit, discharging and charging of the first capacitor connected in parallel to the first switch unit. A function of disposing the second switch unit is to control, through on and off of the second switch unit, discharging and charging of the second capacitor connected in parallel to the second switch unit.

Specifically, the first switch unit may include a first switch and a third resistor. The second switch unit may include a second switch and a fourth resistor.

A function of disposing the first switch is to control, by changing a status of the first switch, the first capacitor to be charged or discharge electricity. A function of disposing the third resistor is to provide a discharging path for the first capacitor, and avoid a short circuit between the positive electrode of the power supply and the ground when the first switch is turned on. A function of disposing the second switch is to control, by changing a status of the second switch, the second capacitor to be charged or discharge electricity. A function of disposing the fourth resistor is to provide a discharging path for the second capacitor, and avoid a short circuit between the negative electrode of the power supply and the ground when the second switch is turned on.

Specifically, a first end of the third resistor is connected to the positive electrode of the power supply, and a second end of the third resistor is connected to a first end of the first switch. A second end of the first switch is connected to the ground. A first end of the second switch is connected to the ground, and a second end of the second switch is connected to a first end of the fourth resistor. A second end of the fourth resistor is connected to the negative electrode of the power supply.

Specifically, the first switch and the second switch may be switch transistors. If the first switch and the second switch are metal oxide semiconductor (MOS) transistors, gates of the MOS transistors may be control ends of the first switch and the second switch and are connected to the processor 204. The processor 204 controls on/off of the MOS transistor to control the state control unit 201 to switch between the first state and the second state. Alternatively, if the first switch and the second switch are bipolar junction transistors (BJT), bases of the BJTs may be the control ends of the first switch and the second switch and are connected to the processor 204. The processor 204 may control on/off of the BJT to control the state control unit 201 to switch between the first state and the second state.

For ease of understanding, the following provides a specific example of the state control unit 201.

Figure 3:
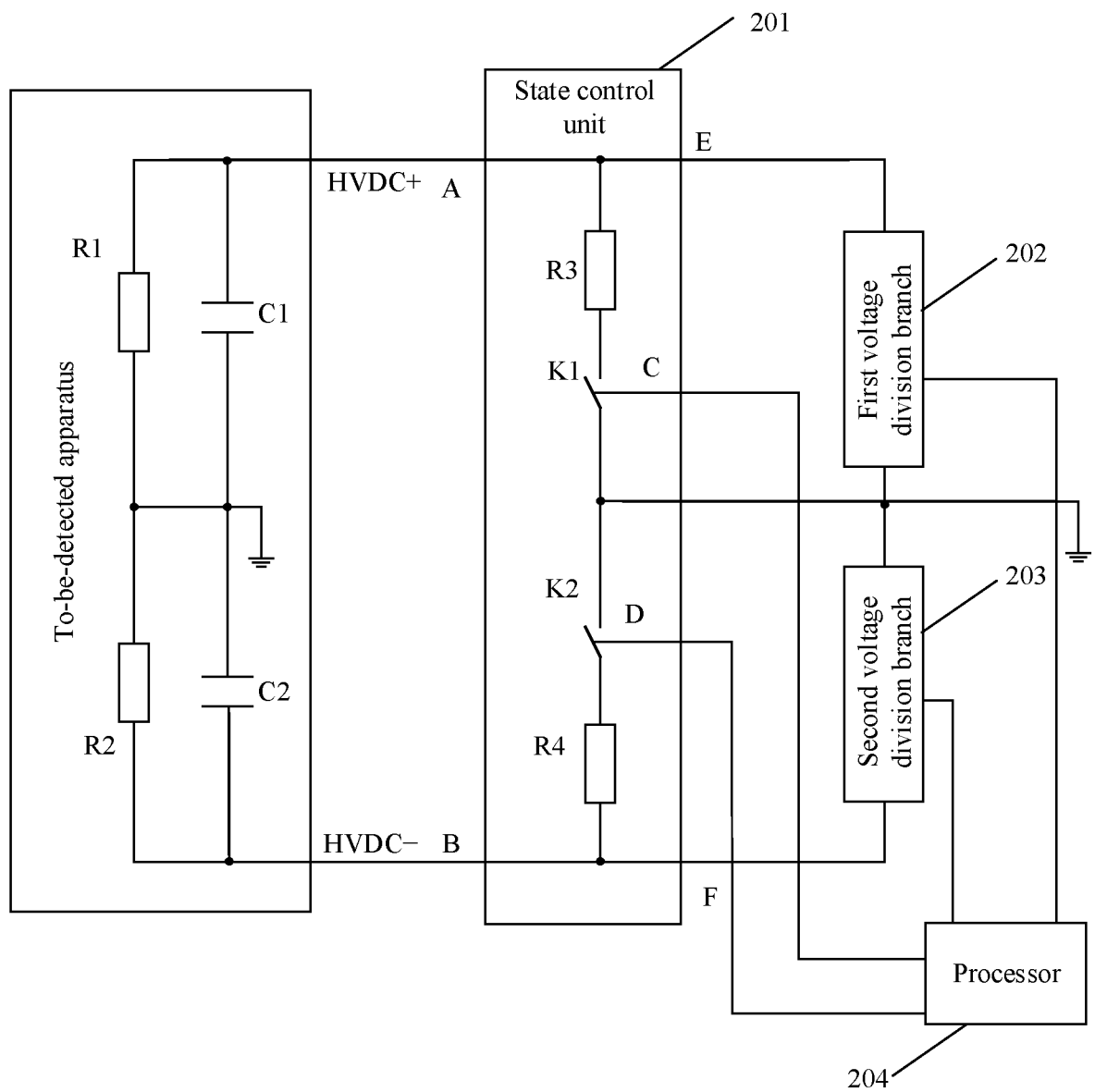
FIG. 3 is a first schematic diagram of a circuit structure of a state control unit according to an embodiment of this application.

FIG. 3 is a schematic diagram of a structure of the state control unit 201 according to an embodiment of this application. A circuit shown in FIG. 3 includes switches K1 and K2 and resistors R3 and R4. As input ends of the state control unit 201, A and B are respectively connected to the positive electrode HVDC+ and the negative electrode HVDC− of the power supply of the to-be-detected apparatus. As control ends of the state control unit 201, both C and D are connected to the processor 204. As output ends of the state control unit 201, E and F are respectively connected to the first voltage division branch 202 and the second voltage division branch 203.

In the state control unit 201 shown in FIG. 3, a connection relationship between the components may be as follows: A first end of R3 is connected to the positive electrode HVDC+ of the power supply of the to-be-detected apparatus, a second end of R3 is connected to a first end of K1, a control end of K1 is connected to the processor 204, a second end of K1 is separately connected to a second end of K2 and a ground cable, a control end of K2 is connected to the processor 204, a second end of K2 is connected to a first end of R4, and a second end of R4 is connected to the negative electrode HVDC− of the power supply of the to-be-detected apparatus.

When the state control unit 201 shown in FIG. 3 is used to control charging and discharging of the first capacitor C1 and the second capacitor C2, using the first capacitor C1 as an example, when K1 is turned off, resistance at two ends of C1 is resistance on the first resistor R1 and the first voltage division branch 202, and the HVDC+ charges the first capacitor C1 by using the first resistor R1 and the first voltage division branch 202 until voltages at the two ends of the first capacitor C1 are charged to steady values. When K1 is turned on, the first capacitor C1 provides current for R3. In this case, the first capacitor C1 discharges electricity by using R3, the first voltage division branch, and the first resistor R1. Similarly, the switch K2 may be controlled to control charging or discharging of the second capacitor C2.

Certainly, the foregoing description of the structure of the state control unit 201 is merely an example. In actual application, the state control unit 201 may also use another structure. For example, the state control unit 201 may use a relay, and an input amount of the relay is changed to implement that the state control unit 201 is in the first state and the second state.

II. First Voltage Division Branch 202

The first voltage division branch 202 is configured to be connected in parallel to the first capacitor C1, and the first voltage division branch 202 may be configured to divide voltages at two ends of the first capacitor C1 to obtain a first voltage waveform.

It should be understood that, because the insulation resistor detection circuit 200 provided in this embodiment of this application is connected to the positive electrode and the negative electrode of the power supply of the to-be-detected apparatus, and a voltage between the positive electrode and the negative electrode of the power supply is relatively high, it may be difficult for directly obtained voltages at the two ends of the first capacitor C1 to meet a voltage requirement of the processor 204. Therefore, a voltage on the first voltage division branch 202 connected in parallel to the first capacitor C1 may be obtained, to output the first voltage waveform that meets the voltage requirement of the processor 204 and that represents a change in the voltages at the two ends of the first capacitor C1.

Specifically, the first voltage division branch 202 may include a fifth resistor and a sixth resistor.

A first end of the fifth resistor is connected to the positive electrode of the power supply, and a second end of the fifth resistor is separately connected to a first end of the sixth resistor and the processor 204. A second end of the sixth resistor is connected to the ground and the processor 204. A resistance value of the sixth resistor is far less than a resistance value of the fifth resistor.

A function of disposing the fifth resistor and the sixth resistor is as follows: Because the first voltage division branch 202 is connected in parallel to the first capacitor C1, the voltages at the two ends of the first capacitor C1 may be divided by using the fifth resistor and the sixth resistor, and voltage waveforms in a charging process and a discharging process of the first capacitor C1 may be obtained by detecting voltage waveforms at two ends of the sixth resistor. Therefore, the voltages at the two ends of the first capacitor C1 are obtained without using a high-voltage detection component that has higher detection costs.

It should be understood that, to detect a small voltage change between two adjacent values in the first voltage waveform and improve accuracy of a detection result, the resistance value of the sixth resistor is far less than the resistance value of the fifth resistor. The resistance values of the fifth resistor and the sixth resistor may be set based on an application scenario of the insulation resistor detection circuit 200 and a specification of the processor 204. Details are not described herein in this application.

Certainly, the foregoing description of the structure of the first voltage division branch 202 is merely an example. In actual application, the first voltage division branch 202 may use another structure. For example, a structure in which more than two resistors are connected in series may be disposed in the first voltage division branch 202.

III. Second Voltage Division Branch 203

The second voltage division branch 203 is configured to be connected in parallel to the second capacitor C2, and the second voltage division branch 203 may be configured to divide voltages at two ends of the second capacitor C2 to obtain a second voltage waveform.

It should be understood that, because the insulation resistor detection circuit 200 provided in this embodiment of this application is connected to the positive electrode and the negative electrode of the power supply of the to-be-detected apparatus, and a voltage between the positive electrode and the negative electrode of the power supply is relatively high, it may be difficult for directly obtained voltages at the two ends of the second capacitor C2 to meet a voltage requirement of the processor 204. Therefore, a voltage on the second voltage division branch 203 connected in parallel to the second capacitor C2 may be obtained, to output the second voltage waveform that meets the voltage requirement of the processor 204 and that represents a change in the voltages at the two ends of the second capacitor C2.

Specifically, the second voltage division branch 203 may include a seventh resistor and an eighth resistor.

A first end of the seventh resistor is connected to the ground and the processor 204, and a second end of the seventh resistor is separately connected to a first end of the eighth resistor and the processor 204. A second end of the eighth resistor is connected to the negative electrode of the power supply. A resistance value of the seventh resistor is far less than a resistance value of the eighth resistor.

A function of disposing the seventh resistor and the eighth resistor is as follows: Because the second voltage division branch 203 is connected in parallel to the second capacitor C2, the voltages at the two ends of the second capacitor C2 may be divided by using the seventh resistor and the eighth resistor, and voltage waveforms in a charging process and a discharging process of the second capacitor C2 may be obtained by detecting voltage waveforms at two ends of the seventh resistor. Therefore, the voltages at the two ends of the second capacitor C2 are obtained without using a high-voltage detection component that has higher detection costs.

It should be understood that, to detect a small voltage change between two adjacent values in the second voltage waveform and improve accuracy of a detection result, the resistance value of the seventh resistor is far less than the resistance value of the eighth resistor. The resistance values of the seventh resistor and the eighth resistor may be set based on an application scenario of the insulation resistor detection circuit 200 and a specification of the processor 204. Details are not described herein in this application.

Certainly, the foregoing description of the structure of the second voltage division branch 203 is merely an example. In actual application, the second voltage division branch 203 may use another structure. For example, a structure in which more than two resistors are connected in series may be disposed in the second voltage division branch 203.

IV. Processor 204

The processor 204 is separately connected to the state control unit 201, the first voltage division branch 202, and the second voltage division branch 203. The processor 204 may be configured to: calculate, based on the first voltage waveform obtained at a current moment, voltage feature values of the first capacitor at different moments in specified duration before the current moment; calculate, based on the second voltage waveform obtained at the current moment, voltage feature values of the second capacitor at different moments in the specified duration before the current moment; determine a next switching moment of the state control unit 201 based on the voltage feature values of the first capacitor at the different moments and/or the voltage feature values of the second capacitor at the different moments; and control, when the next switching moment arrives, the state control unit 201 to switch a state. The processor 204 may be further configured to: after controlling, when the next switching moment arrives, the state control unit 201 to switch a state, determine a resistance value of a first resistor R1 and a resistance value of a second resistor R2 based on the first voltage waveform and the second voltage waveform that are respectively obtained in the first state and the second state. The first resistor R1 is an insulation resistor between the positive electrode of the power supply and the ground, the second resistor R2 is an insulation resistor between the negative electrode of the power supply and the ground, and the resistance value of the first resistor R1 and the resistance value of the second resistor R2 are used to determine whether an insulation resistor in the to-be-detected apparatus is faulty.

The voltage feature value of the first capacitor may be but is not limited to a time constant of the first capacitor and/or a voltage waveform status of the first capacitor. The voltage feature value of the second capacitor may be but is not limited to a time constant of the second capacitor and/or a voltage waveform status of the second capacitor. The voltage waveform status of the first capacitor represents fluctuation trends of the voltages at the two ends of the first capacitor, and the voltage waveform status of the second capacitor represents fluctuation trends of the voltages at the two ends of the second capacitor.

For example, if the voltage feature value of the first capacitor is a voltage waveform status, when in any two adjacent voltage values in the first voltage waveform, a latter second value is greater than a preset threshold of a former first value, it may be determined that fluctuation trends of the voltages at the two ends of the first capacitor are "ascending" at a moment corresponding to the second value, and it may be determined that the voltage feature value of the first capacitor is 1 at the moment corresponding to the second value. Alternatively, if the latter second value is less than the preset threshold of the former first value, it may be determined that the fluctuation trends of the voltages at the two ends of the first capacitor are "descending" at the moment corresponding to the second value, and it may be determined that the voltage feature value of the first capacitor is 0 at the moment corresponding to the second value. The preset threshold may be set based on an application scenario of the insulation resistor detection circuit 200. Details are not described herein in this application.

Specifically, when it is determined that a difference between any two adjacent voltage feature values in the voltage feature values of the first capacitor voltage at the different moments is greater than a preset error threshold, and/or a difference between any two adjacent voltage feature values in the voltage feature values of the second capacitor voltage at the different moments is greater than the preset error threshold, it may be determined that the resistance value of the first resistor R1 and/or the resistance value of the second resistor R2 change/changes at the moment, and the current moment may be determined as the next switching moment, so as to obtain, as soon as possible, a first voltage waveform and a second voltage waveform that are obtained after the resistance value of the first resistor R1 and/or the resistance value of the second resistor R2 change/changes, and use the re-obtained first voltage waveform and second voltage waveform to accurately detect whether an insulation fault currently occurs in the to-be-detected apparatus.

Specifically, when it is determined that a difference between any two adjacent voltage feature values in the voltage feature values of the first capacitor voltage at the different moments is less than or equal to the preset error threshold, and/or that a difference between any two adjacent voltage feature values in the voltage feature values of the second capacitor at the different moments is less than or equal to the preset error threshold, it may be determined that the resistance value of the first resistor R1 and the resistance value of the second resistor R2 remain unchanged at the moment, a time constant of the first capacitor and a time constant of the second capacitor are determined, correct switching time of the state control unit 201 is calculated based on the time constant of the first capacitor and/or the time constant of the second capacitor, and a current resistance value of the first resistor R1 and a current resistance value of the second resistor R2 are accurately calculated by using a first voltage waveform and a second voltage waveform that are obtained after switching. When the voltage feature value of the first capacitor is a voltage waveform status, the preset error threshold may be set to 1. When the voltage feature value of the first capacitor is a time constant, the time constant of the first capacitor may be an average value of the voltage feature values of the first capacitor voltage at the different moments, and the preset error threshold may be set based on an application scenario of the insulation resistor detection circuit 200 and an accurate requirement set for a detection result in the application scenario. Details are not described herein in this application.

It should be understood that, to quickly calculate the resistance value of the first resistor R1 and the resistance value of the second resistor R2, the insulation resistor detection circuit 200 provided in this embodiment of this application may further include a ninth resistor and a third switch.

Specifically, a second end of the third switch is connected to the ground, and a control end of the third switch is connected to the processor 204.

The processor 204 may be further configured to: control the third switch to be turned on and turned off, and calculate a parallel resistance value of the first resistor and the second resistor based on the first voltage waveform obtained on the first voltage division branch 202 and the second voltage waveform obtained on the second voltage division branch 203 in the first state and the second state after the next switching moment arrives and voltage waveforms obtained at two ends of the ninth resistor when the third switch is turned on. The parallel resistance value may be used to determine whether an insulation resistor in the to-be-detected apparatus is faulty.

It should be understood that, because the first voltage waveform and the second voltage waveform need to be obtained in real time or periodically, and the resistance value of the first resistor and the resistance value of the second resistor or the parallel resistance value of the first resistor and the second resistor need to be calculated by using the first voltage waveform and the second voltage waveform that are obtained in specific duration, the insulation resistor detection circuit 200 may further include a memory configured to store the first voltage waveform and the second voltage waveform.

Figure 4:
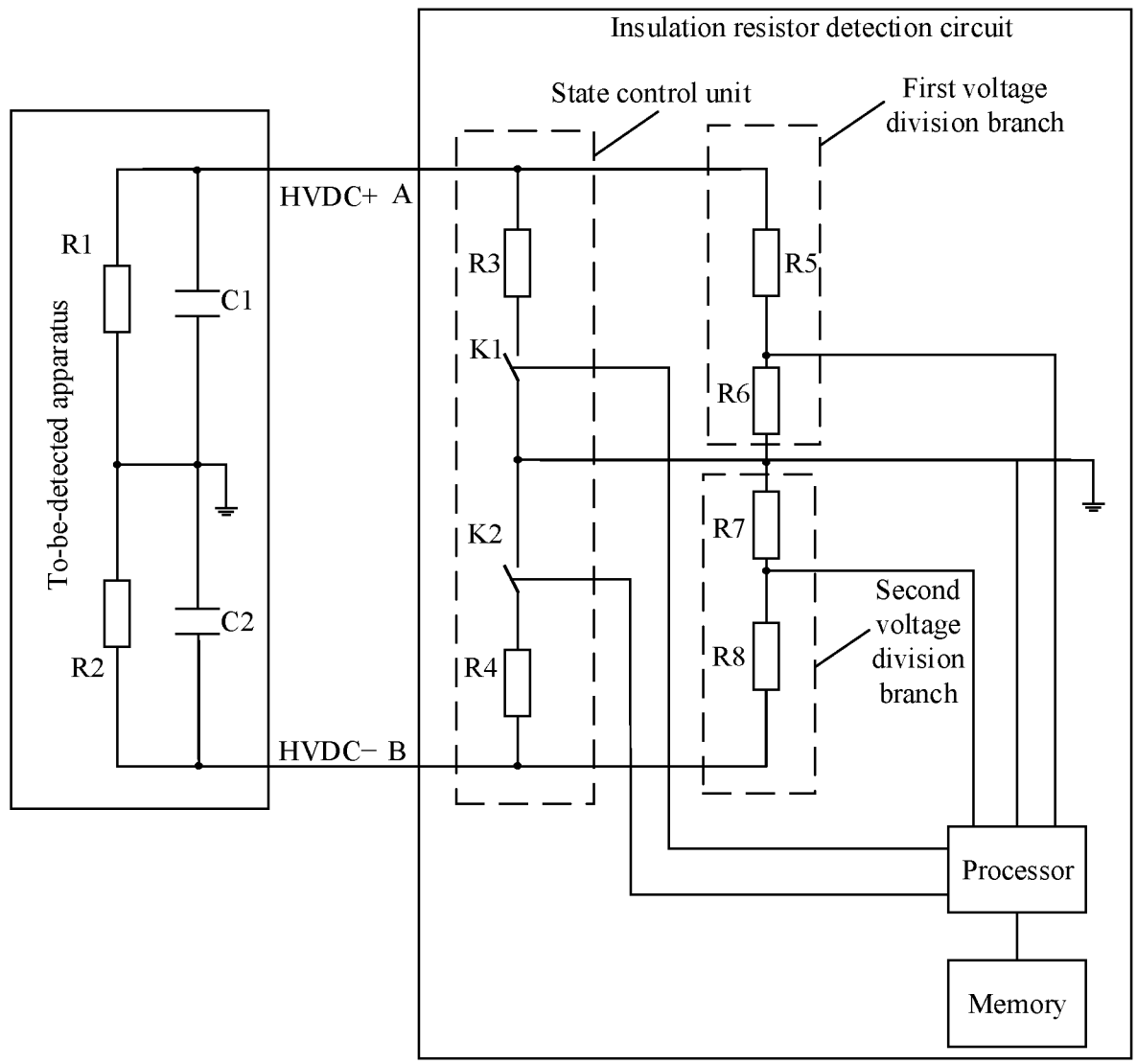
FIG. 4 is a first schematic diagram of a circuit structure of an insulation resistor detection circuit according to an embodiment of this application.

With reference to the foregoing description, for example, FIG. 4 is a diagram of a circuit structure of an insulation resistor detection circuit according to an embodiment of this application.

The insulation resistor detection circuit may include a state control unit, a first voltage division branch, a second voltage division branch, and a processor.

The state control unit includes switches K1 and K2 and resistors R3 and R4. A first end of R3 is connected to a positive electrode HVDC+ of a power supply of a to-be-detected apparatus, a second end of R3 is connected to a first end of K1, a second end of K1 is connected to the ground, a first end of K2 is connected to the ground, a second end of K2 is connected to a first end of R4, a second end of R4 is connected to a negative electrode HVDC− of the power supply of the to-be-detected apparatus, and control ends of K1 and K2 both are connected to the processor.

The first voltage division branch includes a fifth resistor R5 and a sixth resistor R6. A first end of R5 is connected to the positive electrode of the power supply, a second end of R5 is separately connected to a first end of R6 and the processor, and a second end of R6 is connected to the ground and the processor. The two ends of R6 output a first voltage waveform.

The second voltage division branch includes a seventh resistor R7 and an eighth resistor R8. A first end of R7 is connected to the ground and the processor, a second end of R7 is separately connected to a first end of R8 and the processor, and a second end of R8 is connected to the negative electrode of the power supply. The two ends of R7 output a second voltage waveform.

In the processor, the processor is separately connected to the two ends of R6, the two ends of R7, the control end of K1, the control end of K2, and a memory.

When the insulation resistor detection circuit shown in FIG. 4 is used to detect a first resistor and a second resistor, A and B serve as single-phase input ends and are respectively connected to the positive electrode HVDC+ of the power supply of the to-be-detected apparatus and the negative electrode HVDC− of the power supply, and energy is transmitted from left to right. C1 is a regulatory capacitor between the positive electrode of the power supply of the to-be-detected apparatus and the ground, C2 is a regulatory capacitor between the negative electrode of the power supply of the to-be-detected apparatus and the ground, R1 is an insulation resistor between the positive electrode of the power supply of the to-be-detected apparatus and the ground, and R2 is an insulation resistor between the negative electrode of the power supply of the to-be-detected apparatus and the ground.

With reference to FIG. 4, the following describes a working principle of the insulation resistor detection circuit provided in this embodiment of this application.

The following is described by using an example in which that K1 is turned on and K2 is turned off is a switch state 1, and that K1 is turned off and K2 is turned on is a switch state 2. K1 and K2 switch between the switch state 1 and the switch state 2 under control of the processor.

The processor sends a first control signal to K1 and K2, and K1 and K2 are in the switch state 1 in response to the first control signal. In this case, the first capacitor C1 discharges electricity by using R1, R5, R6, and R3, the second capacitor C2 is charged by using R2, R7, and R8, and the processor obtains the first voltage waveform by using a port connected to R6 and obtains the second voltage waveform by using a port connected to R7. The processor calculates, based on the first voltage waveform obtained at a current moment, voltage feature values of the first capacitor at different moments in specified duration before the current moment, and/or calculates, based on the second voltage waveform obtained at the current moment, voltage feature values of the second capacitor at different moments in the specified duration before the current moment; and determines a next switching moment. If a difference between any two adjacent voltage feature values in the voltage feature values of the first capacitor at the different moments is less than or equal to a preset error threshold, and/or a difference between any two adjacent voltage feature values in the voltage feature values of the second capacitor at the different moments is less than or equal to the preset error threshold, it may be determined that a resistance value of the first resistor and a resistance value of the second resistor remain unchanged before the current moment, the next switching moment may be determine by using a time constant that is of the first capacitor and that is calculated based on the first voltage waveform obtained at the current moment and/or a time constant that is of the second capacitor and that is calculated based on the second voltage waveform obtained at the current moment, and when the next switching moment arrives, a second control signal is sent to K1 and K2 to control K1 and K2 to switch from the switch state 1 to the switch state 2. Alternatively, if a difference between any two adjacent voltage feature values in the voltage feature values of the first capacitor at the different moments is greater than the preset error threshold, and/or a difference between two adjacent voltage feature values in the voltage feature values of the second capacitor at the different moments is greater than the preset error threshold, it may be determined that the resistance value of the first resistor and the resistance value of the second resistor change before the current moment, the current moment may be determined as the next switching moment, and the second control signal is sent to K1 and K2 to control K1 and K2 to switch from the switch state 1 to the switch state 2. The first resistor R1 is an insulation resistor between the positive electrode of the power supply and the ground, the second resistor R2 is an insulation resistor between the negative electrode of the power supply and the ground, and the resistance value of the first resistor R1 and the resistance value of the second resistor R2 are used to determine whether an insulation resistor in the to-be-detected apparatus is faulty.

It should be understood that, because the first capacitor C1 and the second capacitor C2 are connected in series between the positive electrode HVDC+ of the power supply of the to-be-detected apparatus and the negative electrode HVDC− of the power supply, when the resistance value of the first resistor R1 connected in parallel to the first capacitor C1 changes, voltages at two ends of the first capacitor C1 change, a voltage value between the positive electrode HVDC+ of the power supply and the negative electrode HVDC− of the power supply remains unchanged, and voltages at two ends of the second capacitor C2 also change correspondingly. Therefore, voltage feature values of the first capacitor at different moments or voltage feature values of the second capacitor at different moments may be detected to determine whether the resistance value of the first resistor and the resistance value of the second resistor change.

For example, when the obtained first voltage waveform is used to calculate the voltage feature values of the first capacitor at the different moments, if the resistance value of the first resistor R1 changes by a relatively small value, in the calculated voltage feature values of the first capacitor at the different moments, a difference between the voltage feature value at a moment corresponding to the resistance value of the first resistor R1 and the voltage feature value calculated at any adjacent moment is relatively small, and a detection error is caused. Therefore, the voltage feature values of the first capacitor at the different moments and the voltage feature values of the second capacitor at the different moments may be simultaneously calculated, to accurately determine whether the resistance value of the first resistor R1 and the resistance value of the second resistor R2 change before the current moment.

For example, if the voltage feature value of the first capacitor is the time constant of the first capacitor, when it is determined that the resistance value of the first resistor and the resistance value of the second resistor remain unchanged before the current moment, an average value of the calculated voltage feature values of the first capacitor at the different moments may be used as the time constant of the first capacitor, and the next switching moment is calculated. The next switching moment may be a corresponding moment at which K1 and K2 switch to the switch state 1 for preset duration. The preset duration is three to five time constants.

After the processor determines the next switching moment, on and off of K1 and K2 in the foregoing switching moment determining manner are used, and the processor obtains the first voltage waveform and the second voltage waveform when K1 and K2 are in the switch state 1 and the switch state 2, to determine the resistance value of the first resistor R1 and the resistance value of the second resistor R2.

Specifically, when it is determined that the resistance value of the first resistor R1 and the resistance value of the second resistor R2 change, the current moment may be determined as the next switching moment, so as to obtain, as soon as possible, a corresponding first voltage waveform and a corresponding second voltage waveform when the resistance value of the first resistor R1 and the resistance value of the second resistor R2 change at the next switching moment, calculate the resistance value of the first resistor R1 and the resistance value of the second resistor R2 by using the obtained first voltage waveform and second voltage waveform, and determine, based on the resistance value of the first resistor R1 and the resistance value of the second resistor R2, whether the to-be-detected apparatus is faulty.

For example, when it is determined that the resistance value of the first resistor R1 or the resistance value of the second resistor R2 is less than a first preset insulation threshold, it is determined that the resistance value of the first resistor R1 and the resistance value of the second resistor R2 cannot meet a requirement of the to-be-detected apparatus for insulation resistance, and a turn-off instruction is sent to the to-be-detected apparatus, where the turn-off instruction is used to instruct the to-be-detected apparatus to disconnect the power supply from a load, to ensure running safety of the to-be-detected apparatus.

With reference to FIG. 4, the following uses an example in which the voltage feature value of the first capacitor and the voltage feature value of the second capacitor are time constants to describe in detail a specific process of calculating, based on the first voltage waveform obtained at the current moment, the voltage feature values of the first capacitor at the different moments in the specified duration before the current moment.

It should be noted that R5 and R6 are connected in series and then connected in parallel to the first capacitor C1, and R7 and R8 are connected in series and then connected in parallel to the second capacitor C2. Therefore, values that correspond to a first moment and that are in first voltage waveforms at the two ends of R6 are in a ratio relationship with values that correspond to the first moment and that are in voltage waveforms at the two ends of the first capacitor C1, and values that correspond to the first moment and that are in second voltage waveforms at the two ends of R7 are in a ratio relationship with values that correspond to the first moment and that are in voltage waveforms at the two ends of the second capacitor C2. Therefore, for ease of understanding, the following uses the voltage waveforms at the two ends of the first capacitor C1 and the second capacitor C2 as examples to describe in detail a process of calculating the voltage feature values of the first capacitor at the different moments.

The processor sends the first control signal to the control ends of K1 and K2, and K1 and K2 are in the switch state 1 in response to the first control signal. In this case, the first capacitor C1 discharges electricity by using R1, R5, R6, and R3, and the second capacitor C2 is charged by using R2, R7, and R8. In this case, voltages U1 at the two ends of the first capacitor C1 and voltages U2 at the two ends of the second capacitor C2 meet a relationship equation commonly used for capacitor charging/discharging:

$$U1(t) = U1\_st - (U1st - V0) * e^{\wedge}(-t/\tau 1); \quad \text{and}$$
$$U2(t) = U2\_st - (U2st - V2) * e^{\wedge}(-t/\tau 2).$$

V0 and V2 are respectively a first voltage value and a second voltage value when K1 and K2 switch to the switch state 1, U1st and U2st are respectively values at the two ends of the first capacitor and values at the two ends of the second capacitor when K1 and K2 switch to a switch state 1, τ1 and τ2 are respectively the time constant of the first capacitor C1 and the time constant of the second capacitor C2, and t is a corresponding moment after the first capacitor C1 and the second capacitor C2 switch to a first state. The first capacitor C1 discharges electricity by using R1, R5, R6, and R3, and the second capacitor C2 discharges electricity by using R2, R7, and R8. Therefore, τ1=C1*(R1∥R3∥R5+R6), and τ2=C2*(R2∥R7+R8). C1 is a capacitance value of the first capacitor C1, and C2 is a capacitance value of the second capacitor C2.

Figure 5:
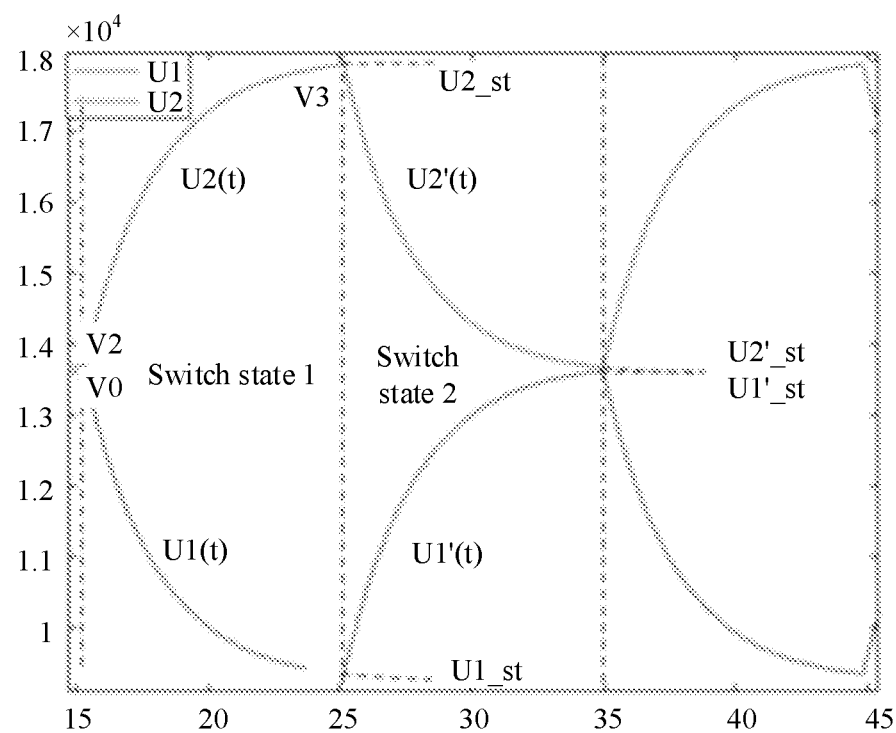
FIG. 5 is a first schematic diagram of change curves of a first voltage and a second voltage according to an embodiment of this application.

Specifically, if the resistance value of the first resistor R1 and the resistance value of the second resistor R2 remain unchanged before the current moment, as shown in FIG. 5, the first voltage waveform before the current moment and the second voltage waveform obtained at the current moment change according to a fixed rule. U1'(t) is a voltage waveform corresponding to the first capacitor C1 when K1 and K2 are in the switch state 1, and U2'(t) is a voltage waveform corresponding to the second capacitor C2 when K1 and K2 are in the switch state 1.

Figure 6:
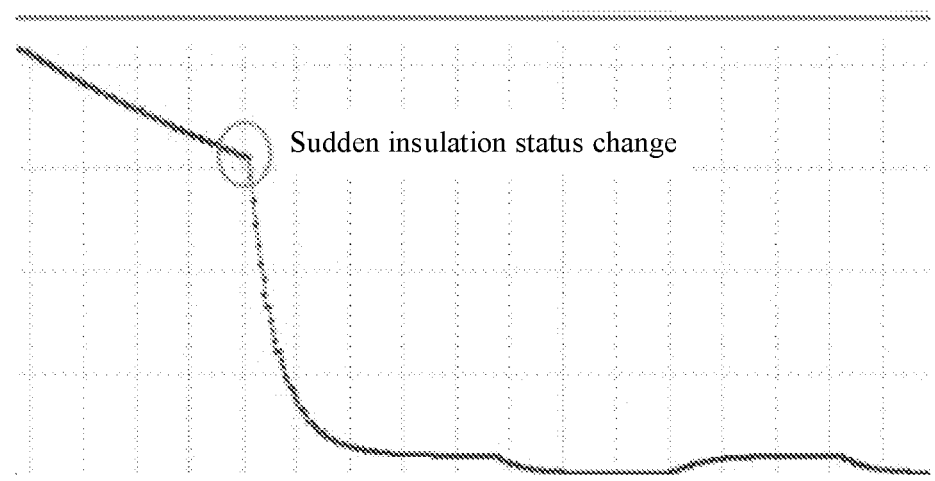
FIG. 6 is a second schematic diagram of change curves of a first voltage and a second voltage according to an embodiment of this application.
Figure 7:
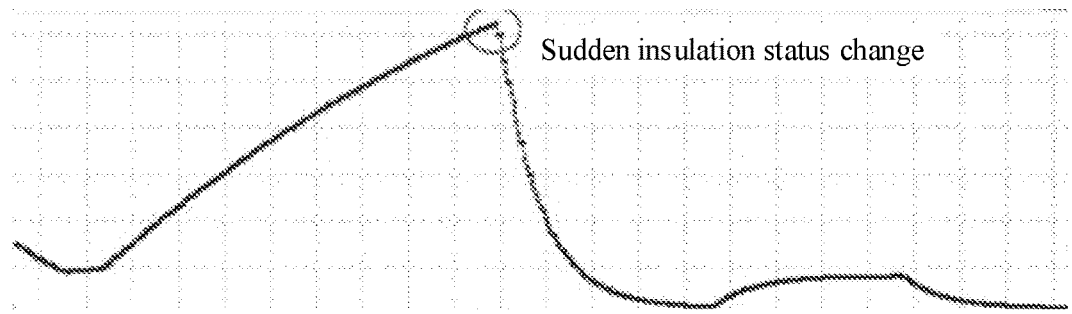
FIG. 7 is a third schematic diagram of change curves of a first voltage and a second voltage according to an embodiment of this application.

When the resistance value of the first resistor R1 and the resistance value of the second resistor R2 change, as shown in FIG. 6 or FIG. 7, the first voltage waveform and the second voltage waveform change according to a first rule before the resistance value of the first resistor R1 and the resistance value of the second resistor R2 change, and the first voltage waveform and the second voltage waveform change according to a second rule after the resistance value of the first resistor R1 and the resistance value of the second resistor R2 change. A sudden insulation status change means that the resistance value of the first resistor R1 and the resistance value of the second resistor R2 change.

To determine whether the resistance value of the first resistor R1 and the resistance value of the second resistor R2 change, voltage feature values of the first capacitor at different moments and/or voltage feature values of the second capacitor at different moments first need to be calculated. With reference to the foregoing formula, the following uses an example in which the voltage feature value of the first capacitor is a time constant to describe in detail a process of determining the voltage feature value of the first capacitor.

The following formula may be obtained by performing derivation on the commonly used charging/discharging formulas corresponding to the voltages at the two ends of the first capacitor in the foregoing formulas:

$$\frac{\partial U1(t)}{\partial t} = \frac{(U1_{st} - V0)}{\tau 1} e^{-\frac{t}{\tau 1}}$$

The following formulas may be obtained by taking a logarithm of the foregoing formula obtained after the derivation:

$$\ln\left(\frac{\partial U1(t)}{\partial t}\right) = \ln\left(\frac{(U1_{st} - V0)}{\tau 1}\right) - \frac{t}{\tau 1}$$

$$\ln\left(\frac{\partial U2(t)}{\partial t}\right) = \ln\left(\frac{(U2_{st} - V2)}{\tau 2}\right) - \frac{t}{\tau 2}$$

In this case, the foregoing formulas that are obtained after the logarithm is taken and that correspond to the first voltages at the two ends of the first capacitor meet a linear formula Y=a+b·X, $$\text{where } a = \ln\left(\frac{(U1_{st} - V0)}{\tau 1}\right), \text{ and } b = -\frac{t}{\tau 1}.$$

X is a corresponding collection moment after K1 switches to the switch state 1. X(i) represents a moment at which an $i^{th}$ point is collected, X(i−1) represents a moment at which an $(i-1)^{th}$ point is collected, M is a specified collected point, Y is a voltage value of the first capacitor. It may be learned that when K1 switches to the switch state 1, M=0 and Y=0. The following calculation is performed to accumulate collected points:

$$M = M + 1$$

$$Y = \ln\left(\frac{U1(x(i)) - U1(x(i-1))}{x(i) - x(i-1)}\right)$$

The collected point M is updated in real time, and the collection moments X(i) that corresponds to the collected point M is accumulated by using a new collected point M and a new collection moment X(i), so as to update values in the foregoing formulas to obtain the following formulas:

$$X=X+X(i)$$

$$XX=XX+X(i)^2$$

$$Y=Y+Y(i)$$

$$XY=XY+X(i)*Y(i)$$

After a quantity M of collected points meets M N points, the value b in the linear formula is obtained through calculation by using the following formula. (N is a natural number).

$$b = \frac{M*XY - X*Y}{M*XX - X*X}$$

Because $$b = -\frac{1}{\tau 1},$$

the time constant $$\tau 1 = -\frac{1}{b}$$

can be obtained through calculation.

A specified quantity of collected points may be obtained by using the first voltage waveform obtained before the current moment.

Similarly, the time constant τ2 of the second capacitor may be obtained through calculation by using the second voltage waveform obtained before the current moment.

The foregoing manner is used to calculate the voltage feature values of the first capacitor at the different moments in the specified duration before the current moment, and calculate the voltage feature values of the second capacitor at the different moments in the specified duration before the current moment.

It should be noted that, based on different structures of the first voltage division branch, the second voltage division branch, and the state control unit that are provided in the foregoing embodiment, the insulation resistor detection circuit provided in this embodiment of this application further has several other structures. Other circuit structures have the same principle, which are not described one by one in detail in this application.

Figure 8:
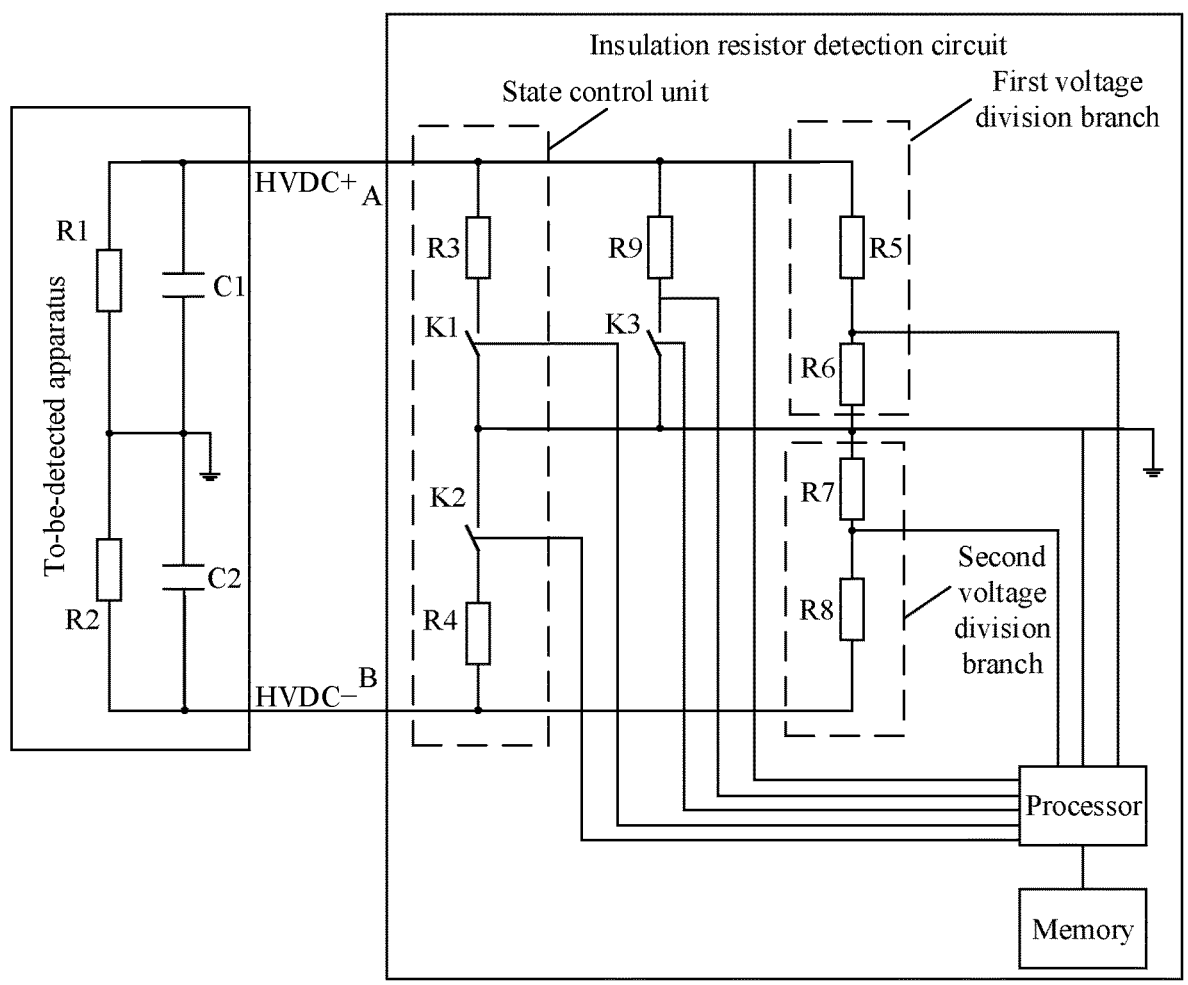
FIG. 8 is a second schematic diagram of a circuit structure of an insulation resistor detection circuit according to an embodiment of this application.

With reference to the foregoing description, for example, FIG. 8 is a diagram of a circuit structure of another insulation resistor detection circuit according to an embodiment of this application.

The insulation resistor detection circuit may include a state control unit, a first voltage division branch, a second voltage division branch, a processor, a ninth resistor R9, and a third switch K3.

The state control unit includes switches K1 and K2 and resistors R3 and R4. A first end of R3 is connected to a positive electrode HVDC+ of a power supply of a to-be-detected apparatus, a second end of R3 is connected to a first end of K1, a second end of K1 is connected to the ground, a first end of K2 is connected to the ground, a second end of K2 is connected to a first end of R4, a second end of R4 is connected to a negative electrode HVDC− of the power supply of the to-be-detected apparatus, and control ends of K1 and K2 both are connected to the processor.

The first voltage division branch includes a fifth resistor R5 and a sixth resistor R6. A first end of R5 is connected to the positive electrode of the power supply, a second end of R5 is separately connected to a first end of R6 and the processor, and a second end of R6 is connected to the ground and the processor. The two ends of R6 output a first voltage waveform.

The second voltage division branch includes a seventh resistor R7 and an eighth resistor R8. A first end of R7 is connected to the ground and the processor, a second end of R7 is separately connected to a first end of R8 and the processor, and a second end of R8 is connected to the negative electrode of the power supply. The two ends of R7 output a second voltage waveform.

In the processor, the processor is separately connected to the two ends of R6, the two ends of R7, the control end of K1, the control end of K2, two ends of R9, a control end of K3, and a memory.

A first end of R9 is separately connected to the positive electrode of the power supply and the processor, a second end of R9 is separately connected to a first end of K3 and the processor, a second end of K3 is connected to the ground, and the control end of K3 is connected to the processor. A resistance value of R3 is less than a preset threshold.

When the insulation resistor detection circuit shown in FIG. 8 is used to detect a first resistor and a second resistor, A and B serve as single-phase input ends and are respectively connected to the positive electrode HVDC+ of the power supply of the to-be-detected apparatus and the negative electrode HVDC− of the power supply, and energy is transmitted from left to right. C1 is a regulatory capacitor between the positive electrode of the power supply of the to-be-detected apparatus and the ground, C2 is a regulatory capacitor between the negative electrode of the power supply of the to-be-detected apparatus and the ground, R1 is an insulation resistor between the positive electrode of the power supply of the to-be-detected apparatus and the ground, and R2 is an insulation resistor between the negative electrode of the power supply of the to-be-detected apparatus and the ground.

With reference to FIG. 8, the following describes a working principle of the insulation resistor detection circuit provided in this embodiment of this application.

The following is described by using an example in which that K1 is turned on and K2 is turned off is a switch state 1, and that K1 is turned off and K2 is turned on is a switch state 2. When K1 and K2 are in the switch state 1, C1 discharges electricity and C2 is charged; and when K1 and K2 are in the switch state 2, C1 is charged and C2 discharges electricity.

The processor sends a first control signal to K3, and K3 is turned on in response to the first control signal. The processor sends a second control signal to K1 and K2, and K1 and K2 are in the switch state 1 in response to the second control signal. In this case, the first capacitor C1 discharges electricity by using R1, R5, R6, R9, and R3, the second capacitor C2 is charged by using R2, R7, and R8, and the processor obtains the first voltage waveform and the second voltage waveform by using ports connected to R6 and R7. The processor calculates, based on the first voltage waveform obtained at a current moment, voltage feature values of the first capacitor at different moments in specified duration before the current moment, and/or calculates, based on the second voltage waveform obtained at the current moment, voltage feature values of the second capacitor at different moments in the specified duration before the current moment; and determines a next switching moment. If a difference between any two adjacent voltage feature values in the voltage feature values of the first capacitor at the different moments is less than or equal to a preset error threshold, and/or a difference between any two adjacent voltage feature values in the voltage feature values of the second capacitor at the different moments is less than or equal to the preset error threshold, it may be determined that a resistance value of the first resistor and a resistance value of the second resistor remain unchanged before the current moment, and the next switching moment may be determined by using a time constant that is of the first capacitor and that is calculated based on the first voltage waveform obtained at the current moment and/or a time constant that is of the second capacitor and that is calculated based on the second voltage waveform obtained at the current moment. Alternatively, if a difference between any two adjacent voltage feature values in the voltage feature values of the first capacitor at the different moments is greater than the preset error threshold, and/or a difference between any two adjacent voltage feature values in the voltage feature values of the second capacitor at the different moments is greater than the preset error threshold, it may be determined that the resistance value of the first resistor and the resistance value of the second resistor change before the current moment, and the current moment may be determined as the next switching moment.

For example, if the voltage feature value of the first capacitor is the time constant of the first capacitor, an average value of the calculated voltage feature values of the first capacitor at the different moments may be used as the time constant of the first capacitor to calculate the next switching moment.

When determining that the next switching moment arrives, the processor may send the second control signal to K3, where K3 is turned on in response to the second control signal; and the processor detects voltage waveforms at the two ends of R9, and determines a parallel resistance value of the first resistor and the second resistor by using the voltage waveforms at the two ends of R9. The first resistor is an insulation resistor between the positive electrode of the power supply and the ground, the second resistor is an insulation resistor between the negative electrode of the power supply and the ground, and the parallel resistance value of the first resistor and the second resistor may be used to determine whether an insulation resistor is faulty.

It should be understood that, when any of the first resistor R1 and the second resistor R2 is faulty, an insulation failure occurs in the to-be-detected apparatus, and a leakage phenomenon occurs. Therefore, K3 may be controlled to be turned off and turned on, the parallel resistance value of the first resistor and the second resistor is calculated by using the voltage waveforms at the two ends of R9 when K3 is turned on, and an insulation status of the to-be-detected apparatus is determined by using the parallel resistance value.

For example, when it is determined that the parallel resistance value of the first resistor R1 and the second resistor R2 is less than a second preset insulation threshold, it is determined that the resistance value of the first resistor and the resistance value of the second resistor cannot meet a requirement of the to-be-detected apparatus for insulation resistance, and a turn-off instruction is sent to the to-be-detected apparatus, where the turn-off instruction may be used to instruct the to-be-detected apparatus to disconnect the power supply from a load, to ensure running safety of the to-be-detected apparatus.

The following describes in detail a process of calculating the parallel resistance values of the first resistor R1 and the second resistor R2.

It should be noted that R5 and R6 are connected in series and then connected in parallel to the first capacitor C1, and R7 and R8 are connected in series and then connected in parallel to the second capacitor C2. Therefore, values that correspond to a first moment and that are in first voltage waveforms at the two ends of R6 are in a ratio relationship with values that correspond to the first moment and that are in voltage waveforms at two ends of the first capacitor C1, and values that correspond to the first moment and that are in second voltage waveforms at the two ends of R7 are in a ratio relationship with values that correspond to the first moment and that are in voltage waveforms at two ends of the second capacitor C2. Therefore, for ease of understanding, the following uses the voltage waveforms at the two ends of the first capacitor C1 and the second capacitor C2 as examples to describe in detail a process of calculating the voltage feature values of the first capacitor at the different moments.

The processor sends the first control signal to the control ends of K1 and K2, and K1 and K2 are in the switch state 1 in response to the first control signal. In this case, the first capacitor C1 discharges electricity by using R1, R5, R6, and R3, and the second capacitor C2 is charged by using R2, R7, and R8.

The foregoing formula for calculating a time constant is used to calculate voltage feature values of the first capacitor at different moments in preset duration before the current moment and/or calculate voltage feature values of the second capacitor at different moments in the preset duration before the current moment, and the next switching moment is determined by using the voltage feature values of the first capacitor at the different moments and/or the voltage feature values of the second capacitor at the different moments.

When the next switching moment is determined, the second control signal may be sent to K3, and K3 is turned on in response to the second control signal. In this case, a Y capacitor (Safety Fixed capacitor) may discharge electricity by using R9, and a time constant $\tau 3$ of the Y capacitor may be calculated by using the foregoing manner of calculating a time constant.

Because $\tau 3 = R_{sum} * C3$, where C3 is a capacitance value of the Y capacitor, when the capacitance value of the Y capacitor is known, a value of $R_{sum}$ may be calculated, where $R_{sum}$ is a parallel resistance value of a plurality of resistors connected in parallel to the Y capacitor. When another resistor other than R1 and R2 is known, the parallel resistance value of R1 and R2 may be calculated, and it is determined, based on the parallel resistance value of R1 and R2, whether an insulation failure occurs in the to-be-detected apparatus. When it is determined that an insulation failure occurs in the to-be-detected apparatus, the power supply of the to-be-detected apparatus is disconnected from a load to ensure running safety of the to-be-detected apparatus.

Specifically, when the parallel resistance value of R1 and R2 is less than the second preset insulation threshold, a current resistance value of R1 and a current resistance value of R2 cannot meet a requirement of the to-be-detected apparatus for insulation resistance, and it is determined that an insulation failure occurs in the to-be-detected apparatus. The second preset insulation threshold may be set based on an application scenario of the to-be-detected apparatus. Details are not described herein in this application.

For example, if the capacitance value of the Y capacitor is not determined, a resistance value of R9 may be set to be less than a preset threshold, where the preset threshold is less than a resistance value of any of resistors including the first voltage division branch, the second voltage division branch, R1, R2, R3, and R4, so that when K3 is turned on, $R_{sum} \approx R_9$. In this case, a value of the Y capacitor may be obtained by using $\tau 3$ obtained through calculation, and the parallel resistance value of the first resistor and the second resistor may be further calculated in the foregoing manner of calculating parallel resistance.

It should be noted that, based on different structures of the first voltage division branch, the second voltage division branch, and the state control unit that are provided in the foregoing embodiment, the insulation resistor detection circuit provided in this embodiment of this application further has several other structures. Other circuit structures have the same principle, which are not described one by one in detail in this application.

Figure 9:
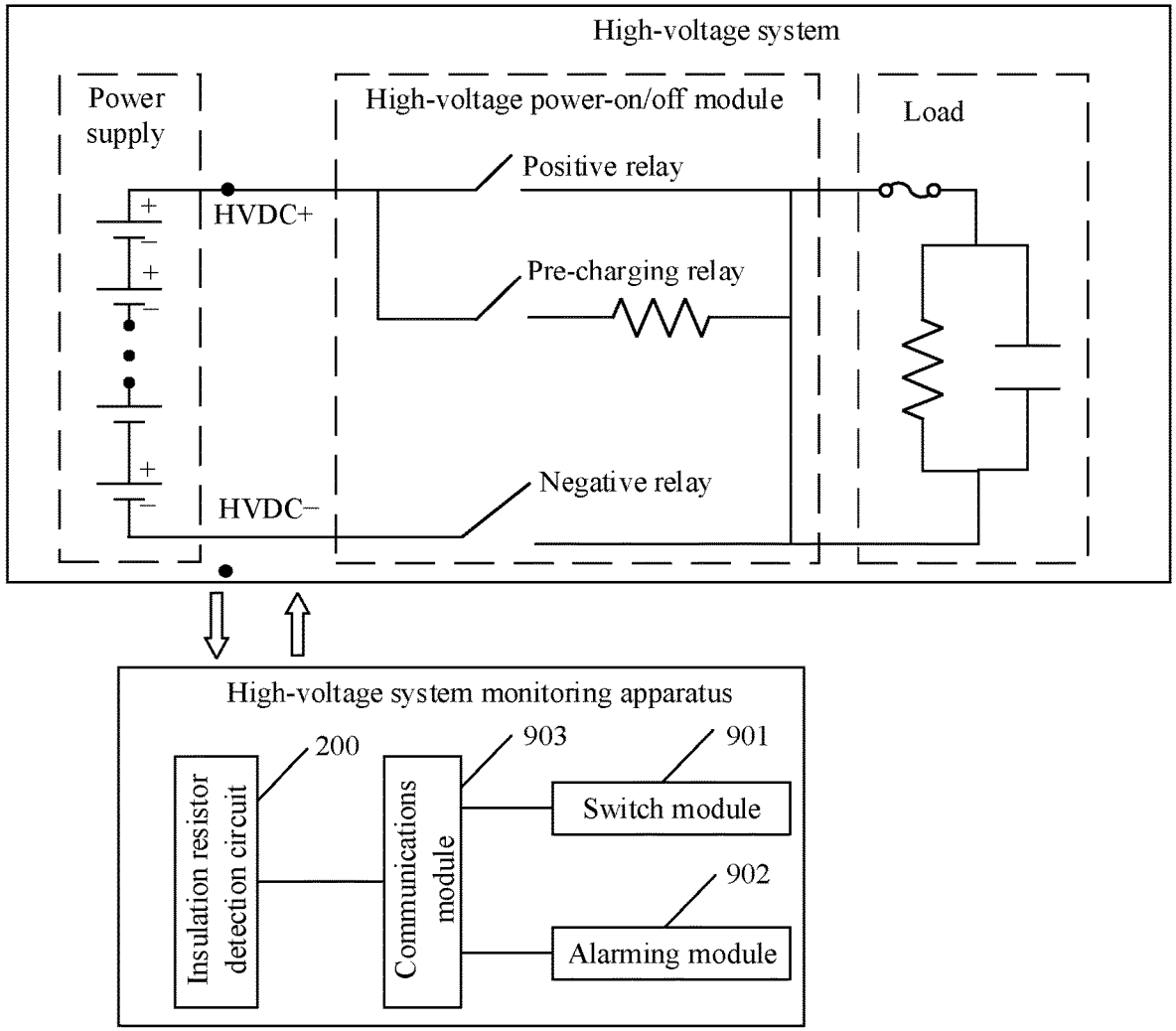
FIG. 9 is a schematic diagram of a structure of a high-voltage system monitoring apparatus according to an embodiment of this application.

Based on a same inventive concept, an embodiment of this application further provides a high-voltage system monitoring apparatus. As shown in FIG. 9, the monitoring apparatus 900 may include a switch module 901, an alarming module 902, a communications module 903, and the insulation resistor detection circuit 200 provided in the embodiments of this application.

The insulation resistor detection circuit 200 may be connected to the communications module 903, and the communications module 903 may be connected to the alarming module 902. The switch module 901 may be configured to be connected between a power supply and a load that are of a high-voltage system. The insulation resistor detection circuit 200 is configured to: detect a resistance value of a first resistor between a positive electrode of the power supply and the ground and a resistance value of a second resistor between a negative electrode of the power supply and the ground, and send the resistance value of the first resistor and the resistance value of the second resistor to the communications module 903. The communications module 903 may be configured to: when determining that the resistance value of the first resistor or the resistance value of the second resistor is less than a first preset resistance threshold, instruct the alarming module 902 to perform alarming; and when the resistance value of the first resistor or the resistance value of the second resistor is less than a second preset resistance threshold, control the switch module 901 to be turned off.

Optionally, the high-voltage system monitoring apparatus 900 may be connected to a high-voltage system of an electric vehicle, to monitor running of the high-voltage system of the electric vehicle and protect running safety of the high-voltage system.

Figure 10:
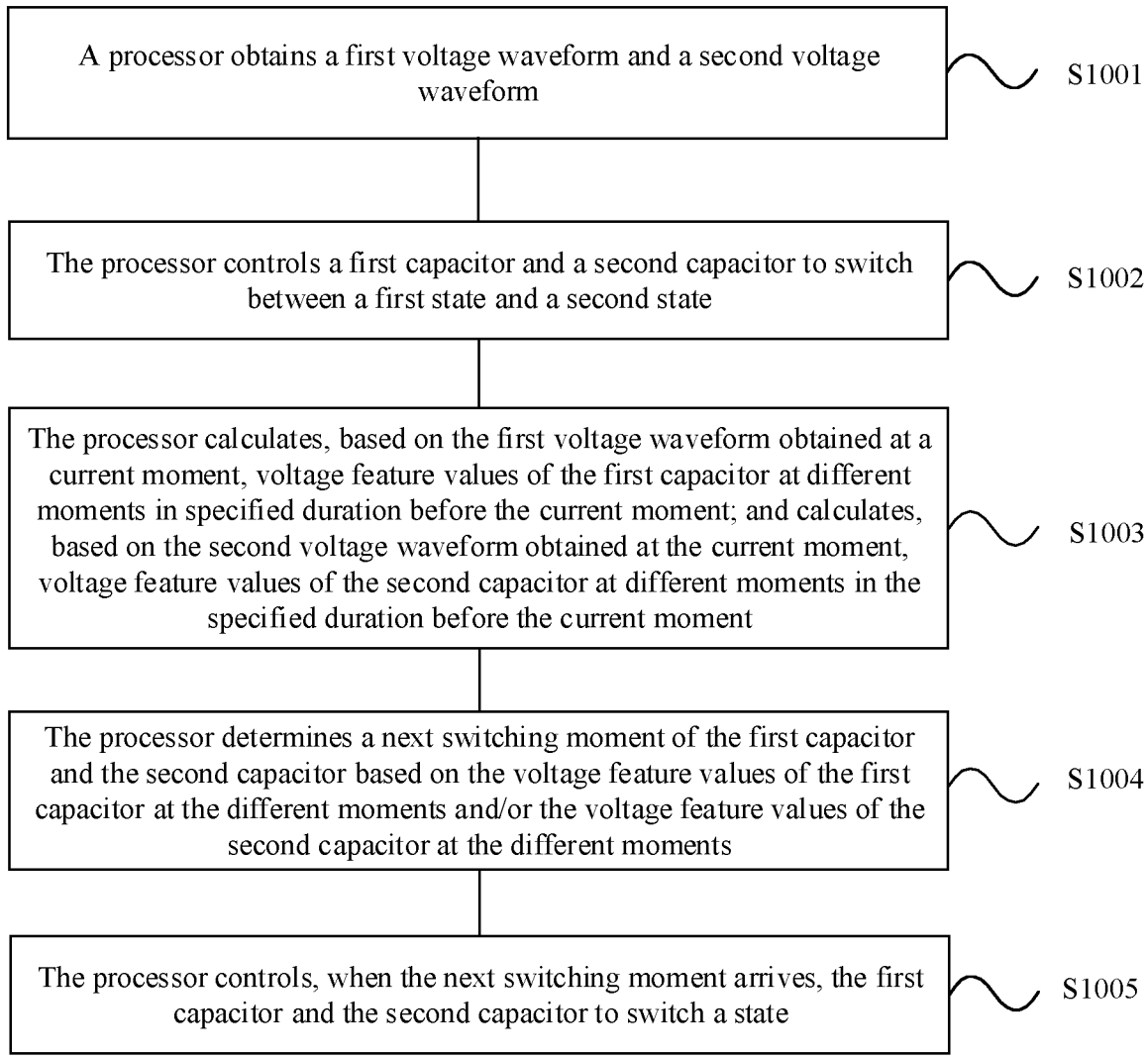
FIG. 10 is a schematic flowchart of an insulation resistor detection method according to an embodiment of this application.

Based on a same inventive concept, an embodiment of this application further provides an insulation resistor detection method. As shown in FIG. 10, the insulation resistor detection method provided in this embodiment of this application is as follows. The method may be performed by the processor shown in FIG. 2, or may be performed by another processor that communicates with the insulation resistor detection circuit shown in FIG. 2.

S1001: The processor obtains a first voltage waveform corresponding to a first capacitor and a second voltage waveform corresponding to a second capacitor. The first capacitor is a capacitor between a positive electrode of a power supply of a to-be-detected apparatus and the ground, and the second capacitor is a capacitor between a negative electrode of the power supply and the ground.

Specifically, when corresponding voltage values in the first voltage waveform and the second voltage waveform are relatively small, the processor may directly obtain the first voltage waveform and the second voltage waveform by using the first capacitor and the second capacitor. Alternatively, when corresponding voltage values in the first voltage waveform and the second voltage waveform are relatively large, it is difficult for the voltage values in the first voltage waveform and the second voltage waveform to meet a requirement of the processor for a voltage value, and a voltage sensor may be connected to the first capacitor and the second capacitor to obtain a first voltage waveform and a second voltage waveform that meet a voltage requirement of the processor.

In an example, when voltage values at two ends of the first capacitor and the second capacitor are relatively large, a voltage division operation may be performed on the voltages at the two ends of the first capacitor and the second capacitor by using a voltage division circuit, to obtain a first voltage waveform and a second voltage waveform after voltage division.

S1002: The processor controls the first capacitor and the second capacitor to switch between a first state and a second state. The first state may be but is not limited to that the first capacitor is charged and the second capacitor discharges electricity, and the second state may be but is not limited to that the first capacitor discharges electricity and the second capacitor is charged.

Specifically, a control signal may be sent to a switch transistor or a relay connected to the first capacitor and the second capacitor, to control the first capacitor and the second capacitor to switch between the first state and the second state.

It should be understood that, because the first capacitor and the second capacitor are connected between the positive electrode and the negative electrode of the power supply of the to-be-detected apparatus after being connected in series, when both the first capacitor and the second capacitor discharge electricity, the voltages at the two ends of the first capacitor and the voltages at the two ends of the second capacitor are relatively small. However, a voltage between the positive electrode and the negative electrode of the power supply of the to-be-detected apparatus is relatively high, the first capacitor and the second capacitor may be broken down in this case, causing a leakage phenomenon. Therefore, there is no case in which the first capacitor and the second capacitor are simultaneously turned on or turned off.

S1003: The processor calculates, based on the first voltage waveform obtained at a current moment, voltage feature values of the first capacitor at different moments in specified duration before the current moment; and calculates, based on the second voltage waveform obtained at the current moment, voltage feature values of the second capacitor at different moments in the specified duration before the current moment. The voltage feature value of the first capacitor may be but is not limited to a time constant of the first capacitor and/or a voltage waveform status of the first capacitor. The voltage feature value of the second capacitor may be but is not limited to a time constant of the second capacitor or a voltage waveform status of the second capacitor.

It should be noted that a process of calculating a voltage feature value is described in detail in the embodiments of this application, and is not repeatedly described herein in this application.

S1004: The processor determines a next switching moment based on the voltage feature values of the first capacitor at the different moments and/or the voltage feature values of the second capacitor at the different moments.

Specifically, any two adjacent voltage feature values in the voltage feature values of the first capacitor at the different moments are compared, and/or any two adjacent voltage feature values in the voltage feature values of the second capacitor at the different moments are compared. When it is determined that a difference between any two adjacent voltage feature values is greater than a preset error threshold, the current moment is determined as the next switching moment. When it is determined that a difference between any two adjacent voltage feature values is less than or equal to the preset error threshold, a time constant of the first capacitor and/or a time constant of the second capacitor are/is determined, and the next switching moment is determined based on the time constant of the first capacitor and/or the time constant of the second capacitor.

For example, if the voltage feature value of the first capacitor is a time constant, an average value of the voltage feature values of the first capacitor at the different moments is used as the time constant of the first capacitor.

S1005: The processor controls, when the next switching moment arrives, the first capacitor and the second capacitor to switch a state.

Specifically, a control instruction is sent to a switch transistor or a relay connected to the first capacitor and the second capacitor, to control the switch transistor or the relay to control the first capacitor and the second capacitor to switch a state.

Specifically, after controlling, when the next switching moment arrives, the first capacitor and the second capacitor to switch a state, the processor may continue to obtain the first voltage waveform and the second voltage waveform, and determine a resistance value of a first resistor and a resistance value of a second resistor based on the continuously obtained first voltage waveform and second voltage waveform. The first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether an insulation resistor is faulty.

Specifically, when it is determined that a difference between any two adjacent voltage feature values is less than or equal to the preset error threshold, the resistance value of the first resistor and the resistance value of the second resistor remain unchanged, and a first voltage value and a second voltage value that respectively correspond to the first voltage waveform and the second voltage waveform at each switching moment of the first capacitor and the second capacitor are recorded. When it is determined that a difference between any two adjacent voltage feature values is greater than the preset error threshold, it is determined that the resistance value of the first resistor and the resistance value of the second resistor change, a first voltage value and a second voltage value that are recorded before the current moment are deleted, and a first voltage value and a second voltage value that respectively correspond to the first voltage waveform and the second voltage waveform at each subsequent switching moment of the first capacitor and the second capacitor are re-recorded. The resistance value of the first resistor and the resistance value of the second resistor are determined by using the recorded first voltage value and second voltage value.

For example, when it is determined that the resistance value of the first resistor or the resistance value of the second resistor is less than a first preset insulation threshold, it is determined that the current resistance value of the first resistor and the current resistance value of the second resistor cannot meet an insulation requirement of the to-be-detected apparatus. To ensure running safety of the to-be-detected apparatus and life safety of an operator, a turn-off instruction is sent to the to-be-detected apparatus, where the turn-off instruction is used to instruct the to-be-detected apparatus to disconnect the power supply from a load. The first preset insulation threshold may be set based on a requirement of the to-be-detected apparatus for insulation resistance. Details are not described herein in this application.

It should be understood that, when it is determined that the resistance value of the first resistor and the resistance value of the second resistor change at the current moment, and the resistance value of the first resistor and the resistance value of the second resistor cannot be calculated by using the first voltage waveform and the second voltage waveform that are obtained before the current moment, the current moment may be determined as the next switching moment, so as to obtain, as soon as possible, a voltage waveform corresponding to the resistance value of the first resistor and that corresponding to the resistance value of the second resistor, and calculate the resistance value of the first resistor and the resistance value of the second resistor by using the obtained voltage waveforms. Therefore, when the resistance value of the first resistor and the resistance value of the second resistor cannot meet a requirement of the to-be-detected apparatus for insulation resistance, the power supply of the to-be-detected apparatus may be disconnected from a load, to avoid an electric shock accident and ensure running safety of the to-be-detected apparatus.

With reference to the circuit shown in FIG. 4, the following describes in detail a process of calculating the resistance value of the first resistor and the resistance value of the second resistor.

In some embodiments of this application, if the resistance value of the first resistor and the resistance value of the second resistor change before the current moment, states of the first capacitor and the second capacitor may be switched, to obtain first voltage values $U1_{st}$ and $U2_{st}$ and second voltage values $U1'_{st}$ and $U2'_{st}$ that correspond to each switching moment and that are respectively in the first voltage waveform and the second voltage waveform that are obtained after state switching.

Values of $U1_{st}$, $U2_{st}$, $U1'_{st}$, and $U2'_{st}$ are known, and the collected $U1_{st}$, $U2_{st}$, $U1'_{st}$, and $U2'_{st}$ are respectively values obtained after the voltages at the two ends of the first capacitor and the second capacitor are divided. Therefore, the value of $U1_{st}$, the value of $U2_{st}$, the value of $U1'_{st}$, and the value of $U2'_{st}$ need to be first converted into the voltages at the two ends of the first capacitor and the voltages at the two ends of the second capacitor. In addition, because the first capacitor and the second capacitor are connected between the positive electrode and the negative electrode of the power supply of the to-be-detected apparatus, the following formulas may be obtained:

$$\frac{U1_{st}}{R_3 \| (R_5 + R_6) \| R1} = \frac{U2_{st}}{(R_7 + R_8) \| R2}$$

$$U1_{st}\frac{R_6 + R_5}{R_6} + U2_{st}\frac{R_7 + R_8}{R_7} = V_{HV}$$

$V_{HV}$ is a voltage between the positive electrode of the power supply of the to-be-detected apparatus and the negative electrode of the power supply, a resistance value of R5 may be the same a resistance value of R8, and resistance values of R6 and R7 may be the same. In this case, the foregoing two formulas can be combined to obtain theoretically steady voltage values of a first collected voltage and a second collected voltage.

$$U1_{st} = \frac{V_{HV}R_3R_6R_1(R_7 + R_2 + R_8)}{R_3(R_1 + R_2)(R_5 + R_6) + (R_7 + R_8)R_1R_{p2} + 2R_3R_1R_2}$$

$$U2_{st} = \frac{V_{HV}R_7R_2((R_5 + R_6)(R_3 + R_1) + R_3R_1)}{(R_3R_2 + R_3R_1 + R_1R_2)(R_7 + R_8)^2 + 2R_3R_1R_2(R_5 + R_6)}$$

Similarly, a relationship equation that is between resistance and steady values of a first voltage and a second voltage when the first capacitor and the second capacitor are in the second state.

$$U1'_{st} = \frac{V_{HV}R_6R_1((R_5 + R_6)(R_3 + R_2) + R_3R_2)}{R_3(R_1 + R_2)(R_5 + R_6) + (R_7 + R_8)R_2R_1 + 2R_3R_2R_1}$$

$$U2'_{st} = \frac{V_{HV}R_3R_7R_2(R_5 + R_6 + R_1)}{(R_3R_2 + R_3R_1 + R_2R_1)(R_5 + R_6)^2 + 2R_3R_1R_2(R_7 + R_8)}$$

Values of R1 and R2 can be obtained by using steady values $U1_{st}$, $U2_{st}$, $U1'_{st}$, and $U2'_{st}$ that are of the first voltage and the second voltage and that are obtained when the first capacitor and the second capacitor are in the first state and the second state:

$$R_1 = -\frac{R_3(R_5 + R_6)(U1_{st}U2'_{st} - U1'_{st}U2_{st})}{(R_5 + R_6)(U1_{st}U2'_{st} + U2_{st}U2'_{st}) + R_3(U1_{st}U2'_{st} - U1'_{st}U2_{st})}$$

$$R_2 = -\frac{R_3(R_7 + R_8)(U1_{st}U2'_{st} - U1'_{st}U2_{st})}{(R_7 + R_8)(U1_{st}U1'_{st} + U1_{st}U2'_{st}) + R_3(U1_{st}U2'_{st} - U1'_{st}U2_{st})}$$

After the processor calculates the resistance value of the first resistor and the resistance value of the second resistor, when determining that the resistance value of the first resistor or the resistance value of the second resistor is less than the first preset insulation threshold, the processor determines that the current resistance value of the first resistor and the current resistance value of the second resistor cannot meet a requirement of the to-be-detected apparatus for insulation resistance, and sends a turn-off instruction to the to-be-detected apparatus, where the turn-off instruction is used to instruct the to-be-detected apparatus to disconnect the power supply from a load.

It should be understood that when any one of the first resistor and the second resistor changes, running safety of the to-be-detected apparatus is affected. Therefore, to reduce a calculation amount, parallel resistance that is of the first resistor and the second resistor and that represents an insulation situation of the to-be-detected apparatus may be directly calculated.

Specifically, after a first time constant $\tau1$ and a second time constant $\tau2$ are calculated by using the foregoing formula, because resistance on a charging/discharging path includes the parallel resistance of the first resistor and the second resistor and resistance of the insulation resistor detection circuit, a parallel resistance value of the first resistor and the second resistor may be obtained through calculation when the resistance of the insulation resistor detection circuit is known.

Specifically, charging/discharging of a Y capacitor in the power supply of the to-be-detected apparatus may be implemented to calculate the parallel resistance value of the first resistor and the second resistor.

A process of calculating the parallel resistance value of the first resistor and the second resistor by using the Y capacitor is described in the foregoing embodiment of this application. Details are not described herein in this application.

After the processor calculates the parallel resistance value of the first resistor and the second resistor, when determining that the parallel resistance is less than a second preset insulation threshold, the processor determines that the parallel resistance value of the first resistor and the second resistor cannot meet an insulation requirement of the to-be-detected apparatus. To ensure running safety of the to-be-detected apparatus and life safety of an operator, a turn-off instruction is sent to the to-be-detected apparatus, where the turn-off instruction is used to instruct the to-be-detected apparatus to disconnect the power supply from a load. The second preset insulation threshold may be set based on a requirement of the to-be-detected apparatus for insulation resistance. Details are not described herein in this application.

Figure 11A:
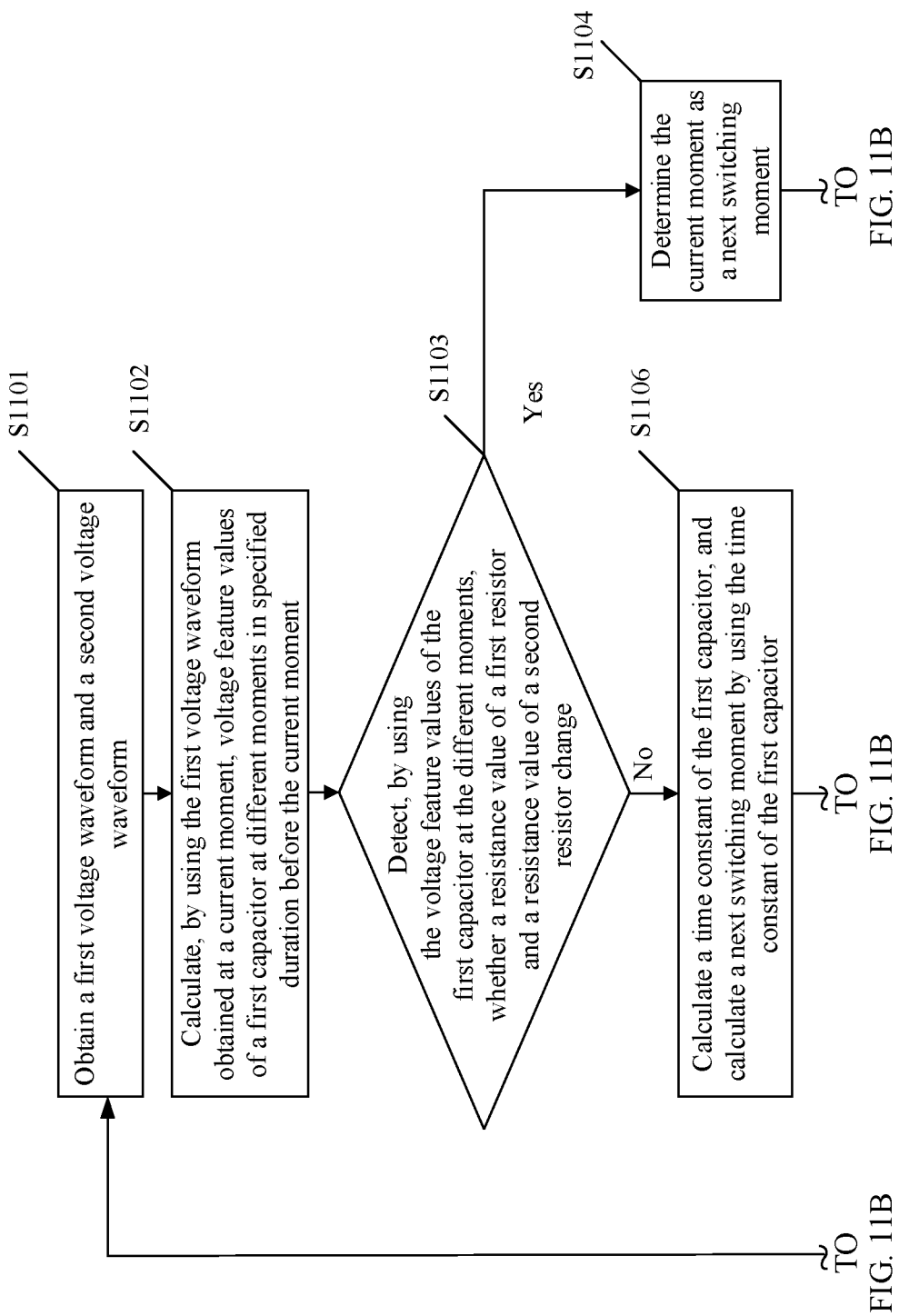
FIG. 11A and FIG. 11B are a schematic flowchart of an insulation resistor detection method according to an embodiment of this application.
Figure 11B:
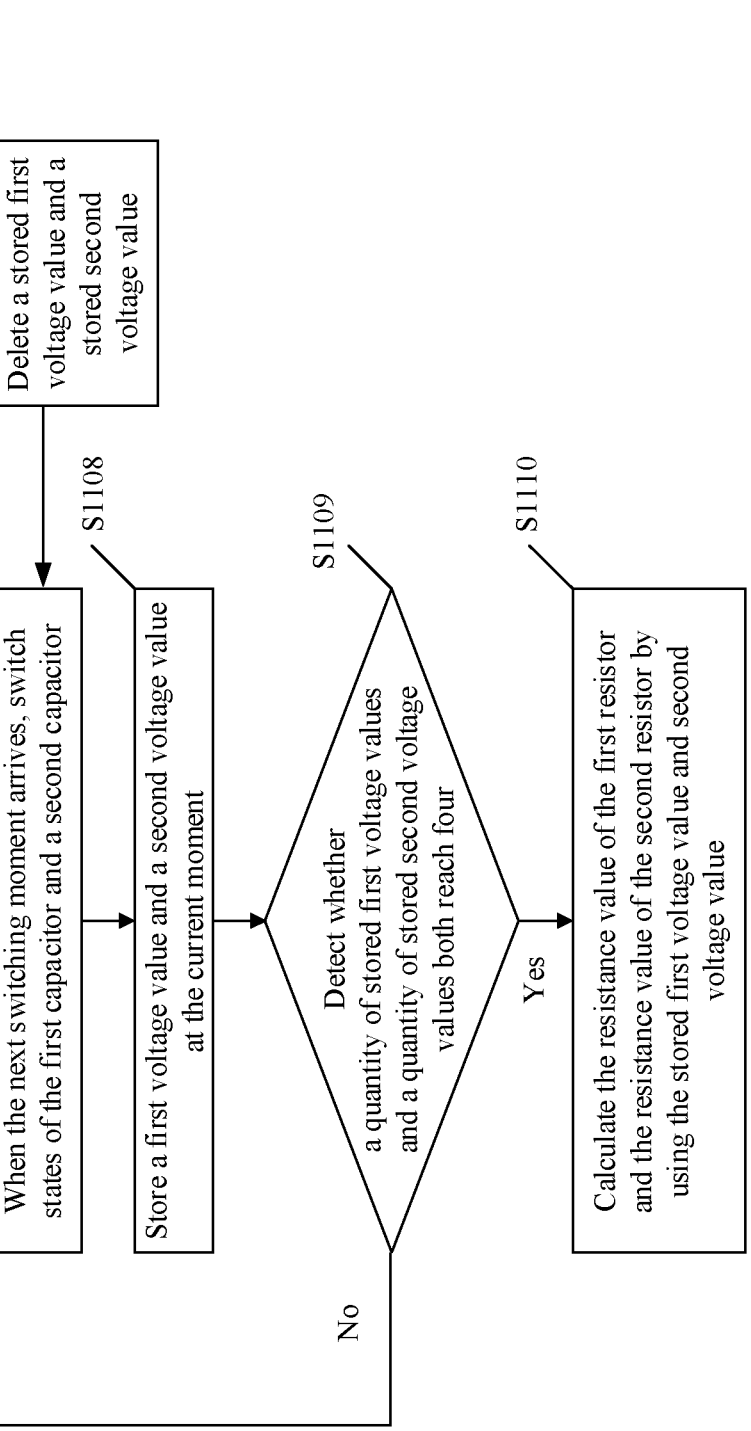

Based on the description of FIG. 10, reference may be made to a schematic flowchart of an insulation resistor detection method shown in FIG. 11A and FIG. 11B. The following describes an insulation resistor detection process in detail by using an example in which a next switching moment is determined based on voltage feature values of a first capacitor at different moments.

S1101: Obtain a first voltage waveform and a second voltage waveform.

S1102. Calculate, by using the first voltage waveform obtained at a current moment, voltage feature values of a first capacitor at different moments in specified duration before the current moment.

S1103. Detect, by using the voltage feature values of the first capacitor at the different moments, whether a resistance value of a first resistor and a resistance value of a second resistor change; and perform S1104 if the resistance value of the first resistor and the resistance value of the second resistor change; or perform S1106 if the resistance value of the first resistor and the resistance value of the second resistor remain unchanged.

S1104: Determine the current moment as a next switching moment.

S1105: Delete a first voltage value and a second voltage value that are stored at the current moment.

S1106: When it is determined that the resistance value of the first resistor remains unchanged, calculate a time constant of the first capacitor, and calculate a next switching moment by using the time constant of the first capacitor.

S1107: When the next switching moment arrives, switch states of the first capacitor and a second capacitor.

S1108: Store a first voltage value and a second voltage value at the current moment.

S1109: Detect whether a quantity of stored first voltage values and a quantity of stored second voltage values both reach four; and perform S1110 if the quantity reaches four; or perform S1101 if the quantity does not reach four.

S1110: Calculate the resistance value of the first resistor and the resistance value of the second resistor by using the stored first voltage value and second voltage value.

Figure 12:
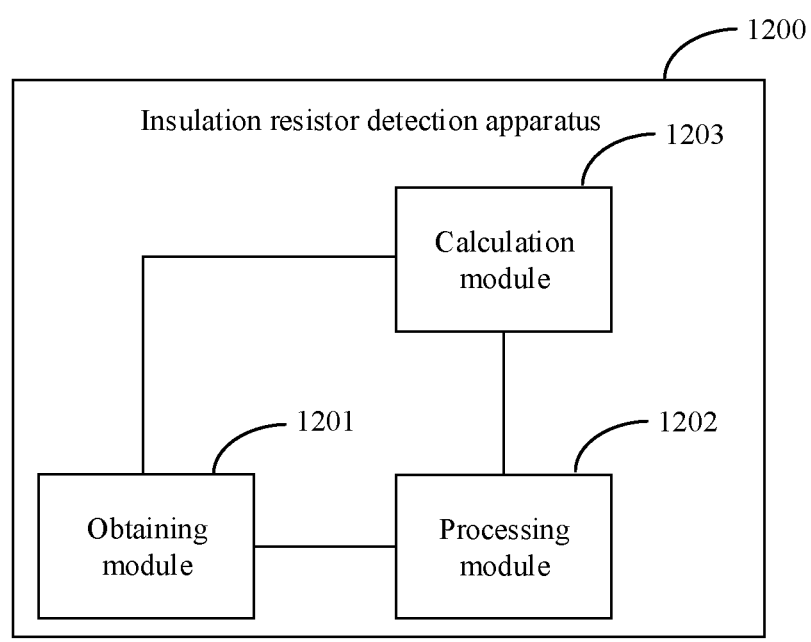
FIG. 12 is a schematic diagram of a structure of an insulation resistor detection apparatus according to an embodiment of this application.

Based on a same technical concept, as shown in FIG. 12, an embodiment of this application further provides an insulation resistor detection apparatus, namely, an insulation resistor detection apparatus 1200. In a design, the insulation resistor detection apparatus 1200 may include an obtaining unit 1201, a processing unit 1202, and a calculation unit 1203.

The obtaining unit 1201 may be configured to obtain a first voltage waveform and a second voltage waveform. A first voltage is voltages at two ends of a first capacitor between a positive electrode of a power supply of a to-be-detected apparatus and the ground, and a second voltage is voltages at two ends of a second capacitor between a negative electrode of the power supply and the ground. The processing unit 1202 may be configured to control the first capacitor and the second capacitor to switch between a first state and a second state. The first state is that the first capacitor is charged and the second capacitor discharges electricity, and the second state is that the first capacitor discharges electricity and the second capacitor is charged. The calculation unit 1203 may be configured to: calculate, based on the first voltage waveform obtained by the obtaining unit 1201 at a current moment, voltage feature values of the first capacitor at different moments in specified duration before the current moment; and calculate, based on the second voltage waveform obtained by the obtaining unit 1201 at the current moment, voltage feature values of the second capacitor at different moments in the specified duration before the current moment.

The processing unit 1202 may be further configured to: determine a next switching moment of the first capacitor and the second capacitor based on the voltage feature values of the first capacitor that are output by the calculation unit 1203 at the different moments and/or the voltage feature values of the second capacitor that are output by the calculation unit 1203 at the different moments; and control, when the next switching moment arrives, the first capacitor and the second capacitor to switch a state.

The obtaining unit 1201 is further configured to: after the first capacitor and the second capacitor are controlled to switch a state when the next switching moment arrives, continue to obtain the first voltage waveform and the second voltage waveform. The processing unit 1202 is further configured to determine a resistance value of a first resistor and a resistance value of a second resistor based on the first voltage waveform and the second voltage waveform that are continuously obtained by the obtaining unit 1201. The first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether an insulation resistor is faulty.

Optionally, the processing unit 1202 is specifically configured to: compare any two adjacent voltage feature values in the voltage feature values of the first capacitor at the different moments, and/or compare any two adjacent voltage feature values in the voltage feature values of the second capacitor at the different moments; when determining that a difference between any two adjacent voltage feature values is greater than a preset error threshold, determine the current moment as the next switching moment; and when determining that a difference between any two adjacent voltage feature values is less than or equal to the preset error threshold, determine a time constant of the first capacitor and/or a time constant of the second capacitor, and determine the next switching moment based on the time constant of the first capacitor and/or the time constant of the second capacitor.

Optionally, the processing unit 1202 is specifically configured to: when determining that a difference between any two adjacent voltage feature values is less than or equal to the preset error threshold, record a first voltage value and a second voltage value that respectively correspond to the first voltage waveform and the second voltage waveform at each switching moment of the first capacitor and the second capacitor; when determining that a difference between any two adjacent voltage feature values is greater than the preset error threshold, delete a first voltage value and a second voltage value that are recorded before the current moment, and re-record a first voltage value and a second voltage value that respectively correspond to the first voltage waveform and the second voltage waveform at each subsequent switching moment of the first capacitor and the second capacitor; and determine the resistance value of the first resistor and the resistance value of the second resistor by using the recorded first voltage value and second voltage value.

Optionally, the processing unit 1202 is further configured to send a turn-off instruction to the to-be-detected apparatus when determining that the resistance value of the first resistor or the resistance value of the second resistor is less than a first preset insulation threshold, where the turn-off instruction is used to instruct the to-be-detected apparatus to disconnect the power supply from a load.

Optionally, the processing unit 1202 is further configured to: determine a parallel resistance value of the first resistor and the second resistor based on the first voltage waveform and second voltage waveform that are continuously obtained by the obtaining unit 1201; and send a turn-off instruction to the to-be-detected apparatus when determining that the parallel resistance value is less than a second preset insulation threshold, where the turn-off instruction is used to instruct the to-be-detected apparatus to disconnect the power supply from a load.

Optionally, the voltage feature value of the first capacitor includes one or more of the following: the time constant of the first capacitor and a voltage waveform status of the first capacitor; the voltage feature value of the second capacitor includes one or more of the following: the time constant of the second capacitor and a voltage waveform status of the second capacitor; the voltage waveform status of the first capacitor represents fluctuation trends of the voltages at the two ends of the first capacitor; and the voltage waveform status of the second capacitor represents fluctuation trends at the two ends of the second capacitor.

Division into the modules in the embodiments of this application is an example, is merely division into logical functions, and may be other division during actual implementation. In addition, functional modules in the embodiments of this application may be integrated into one processor, or each of the modules may exist alone physically, or two or more modules may be integrated into one module. The integrated module may be implemented in a form of hardware, or may be implemented in a form of a software functional module.

An embodiment of this application provides a computer-readable storage medium that stores a computer program. The computer program includes an instruction used to perform the foregoing method embodiments.

An embodiment of this application provides a computer program product including an instruction. When the computer program product runs on a computer, the computer is enabled to perform the foregoing method embodiments.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to the embodiments of this application. It should be understood that computer program instructions may be used to implement each and/or each block in the flowcharts and/or the block diagrams and a combination of a and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more in the flowcharts and/or in one or more blocks in the block diagrams.

These computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more in the flowcharts and/or in one or more blocks in the block diagrams.

These computer program instructions may alternatively be loaded onto a computer or another programmable data processing device, so that a series of operations and steps are performed on the computer or the another programmable device, to generate computer-implemented processing. Therefore, the instructions executed on the computer or the another programmable device provide steps for implementing a specific function in one or more in the flowcharts and/or in one or more blocks in the block diagrams.

Although some embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the spirit and scope of the embodiments of this application. This application is intended to cover these modifications and variations of the embodiments of this application provided that they fall within the scope of protection defined by the following claims and their equivalent technologies.

What is claimed is:

1. An insulation resistor detection circuit, comprising a state control unit, a first voltage division branch, a second voltage division branch, a processor, a to-be-detected apparatus, a first capacitor, a second capacitor, and a ground, wherein the state control unit is connected between a positive electrode and a negative electrode of a power supply of the to-be-detected apparatus; the state control unit is configured to switch between a first state and a second state in response to control from the processor; when the state control unit is in the first state, the first capacitor is configured to charge and the second capacitor is configured to discharge electricity; when the state control unit is in the second state, the first capacitor is configured to discharge electricity and the second capacitor is configured to charge; the first capacitor is a capacitor between the positive electrode of the power supply and the ground; and the second capacitor is a capacitor between the negative electrode of the power supply and the ground;

the first voltage division branch is connected in parallel to the first capacitor, and is configured to divide voltages at two ends of the first capacitor to obtain a first voltage waveform;

the second voltage division branch is connected in parallel to the second capacitor, and is configured to divide voltages at two ends of the second capacitor to obtain a second voltage waveform; and the processor is separately connected to the state control unit, the first voltage division branch, and the second voltage division branch, and the processor is configured to: calculate, based on the first voltage waveform obtained at a current moment, voltage feature values of the first capacitor at different moments in a specified duration before the current moment; calculate, based on the second voltage waveform obtained at the current moment, voltage feature values of the second capacitor at different moments in the specified duration before the current moment; determine a next switching moment based at least on the voltage feature values of the first capacitor at the different moments or the voltage feature values of the second capacitor at the different moments; and control, when the next switching moment arrives, the state control unit to switch a state.

2. The circuit according to claim 1, wherein the insulation resistor detection circuit further comprises a first resistor and a second resistor, and the processor is further configured to: determine a resistance value of the first resistor based on the first voltage waveform that is obtained in the first state and the second state after the next switching moment arrives, and determine a resistance value of the second resistor based on the second voltage waveform that is obtained in the first state and the second state after the next switching moment arrives, wherein the first resistor is an insulation resistor between the positive electrode of the power supply and the ground, the second resistor is an insulation resistor between the negative electrode of the power supply and the ground, and the processor uses the resistance value of the first resistor and the resistance value of the second resistor to determine whether the insulation resistors are faulty.

3. The circuit according to claim 2, wherein the circuit further comprises a ninth resistor and a third switch;

a first end of the ninth resistor is separately connected to the positive electrode of the power supply and the processor, a second end of the ninth resistor is separately connected to a first end of the third switch and the processor, and a resistance value of the ninth resistor;

a second end of the third switch is connected to the ground, and a control end of the third switch is connected to the processor;

the processor is further configured to control the third switch to be turned on and turned off, and the processor is configured to:

calculate a parallel resistance value of the first resistor and the second resistor based on the first voltage waveform and the second voltage waveform that are respectively obtained in the first state and the second state after the next switching moment arrives and voltage waveform obtained at two ends of the ninth resistor when the third switch is turned on, wherein the parallel resistance value is used to determine whether the insulation resistors are faulty.

4. The circuit according to claim 1, wherein the state control unit comprises a first switch unit and a second switch unit;

a first end of the first switch unit is connected to the positive electrode of the power supply, and a second end of the first switch unit is connected to the ground;

a first end of the second switch unit is connected to the negative electrode of the power supply, and a second end of the second switch unit is connected to the ground; and when the first switch unit is turned on and the second switch unit is turned off, the state control unit is configured to be in the first state; and when the first switch unit is turned off and the second switch unit is turned on, the state control unit is configured to be in the second state.

5. The circuit according to claim 4, wherein the first switch unit comprises a first switch and a third resistor;

a first end of the third resistor is connected to the positive electrode of the power supply, and a second end of the third resistor is connected to a first end of the first switch; and a second end of the first switch is connected to the ground, and a control end of the first switch is connected to the processor.

6. The circuit according to claim 4, wherein the second switch unit comprises a second switch and a fourth resistor;

a first end of the second switch is connected to the ground, a second end of the second switch is connected to a first end of the fourth resistor, and a control end of the second switch is connected to the processor; and a second end of the fourth resistor is connected to the negative electrode of the power supply.

7. The circuit according to claim 1, wherein the first voltage division branch comprises a fifth resistor and a sixth resistor;
   a first end of the fifth resistor is connected to the positive electrode of the power supply, and a second end of the fifth resistor is separately connected to a first end of the sixth resistor and the processor; and
   a second end of the sixth resistor is connected to the ground and the processor.

8. The circuit according to claim 1, wherein the second voltage division branch comprises a seventh resistor and an eighth resistor;
   a first end of the seventh resistor is connected to the ground and the processor, and a second end of the seventh resistor is separately connected to a first end of the eighth resistor and the processor; and
   a second end of the eighth resistor is connected to the negative electrode of the power supply.

9. An insulation resistor detection method, comprising:
   obtaining a first voltage waveform corresponding to a first capacitor and a second voltage waveform corresponding to a second capacitor, wherein the first capacitor is a capacitor between a positive electrode of a power supply of a to-be-detected apparatus and the ground, and the second capacitor is a capacitor between a negative electrode of the power supply and the ground;
   controlling the first capacitor and the second capacitor to switch between a first state and a second state, wherein the first state is that the first capacitor is charged and the second capacitor discharges electricity, and the second state is that the first capacitor discharges electricity and the second capacitor is charged;
   calculating, based on the first voltage waveform obtained at a current moment, voltage feature values of the first capacitor at different moments in specified duration before the current moment;
   and calculating, based on the second voltage waveform obtained at the current moment, voltage feature values of the second capacitor at different moments in the specified duration before the current moment;
   determining a next switching moment based on the voltage feature values of the first capacitor at the different moments and/or the voltage feature values of the second capacitor at the different moments; and
   controlling, when the next switching moment arrives, the first capacitor and the second capacitor to switch a state.

10. The method according to claim 9, after the controlling, when the next switching moment arrives, the first capacitor and the second capacitor to switch the state, further comprising:
    continuing to obtain the first voltage waveform and the second voltage waveform;
    determining a resistance value of a first resistor based on the continuously obtained first voltage waveform; and
    determining a resistance value of a second resistor based on the continuously obtained second voltage waveform, wherein the first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether the insulation resistors are faulty.

11. The method according to claim 10, wherein the determining the next switching moment based on the voltage feature values of the first capacitor at the different moments and/or the voltage feature values of the second capacitor at the different moments comprises:
    comparing any two adjacent voltage feature values in the voltage feature values of the first capacitor at the different moments, or comparing any two adjacent voltage feature values in the voltage feature values of the second capacitor at the different moments to determine a difference between the any two adjacent voltage feature values;
    when determining that the difference between the any two adjacent voltage feature values is greater than a preset error threshold, determining the current moment as the next switching moment; and
    when determining that the difference between the any two adjacent voltage feature values is less than or equal to the preset error threshold, determining a time constant of the first capacitor or a time constant of the second capacitor, and determining the next switching moment based on the time constant of the first capacitor and/or the time constant of the second capacitor.

12. The method according to claim 11, wherein the determining the resistance value of the first resistor and the resistance value of the second resistor based on the continuously obtained first voltage waveform and second voltage waveform comprises:
    when determining that the difference between the any two adjacent voltage feature values is less than or equal to the preset error threshold, recording a first voltage value that corresponds to the first voltage waveform at each switching moment of the first capacitor and a second voltage value that corresponds to the second voltage waveform at each switching moment of the second capacitor;
    when determining that a difference between the any two adjacent voltage feature values is greater than the preset error threshold, deleting a first voltage value and a second voltage value that are recorded before the current moment, and re-recording a first voltage value that corresponds to the first voltage waveform at each subsequent switching moment of the first capacitor and a second voltage value that corresponds to the second voltage waveform at each subsequent switching moment of the second capacitor; and
    determining the resistance value of the first resistor by using the recorded first voltage value and the resistance value of the second resistor by using the recorded second voltage value.

13. The method according to claim 10, wherein the method further comprises:
    sending a turn-off instruction to the to-be-detected apparatus when determining that the resistance value of the first resistor or the resistance value of the second resistor is less than a first preset insulation threshold, wherein the turn-off instruction is used to instruct the to-be-detected apparatus to disconnect the power supply from a load.

14. The method according to claim 10, after the continuing to obtain the first voltage waveform and the second voltage waveform, further comprising:
    determining a parallel resistance value of the first resistor and the second resistor based on the continuously obtained first voltage waveform and second voltage waveform; and sending a turn-off instruction to the to-be-detected apparatus when determining that the parallel resistance value is less than a second preset insulation threshold, wherein the turn-off instruction is used to instruct the to-be-detected apparatus to disconnect the power supply from a load.

15. The method according to claim 9, wherein the voltage feature value of the first capacitor comprises one or more of the following: the time constant of the first capacitor and a voltage waveform status of the first capacitor;

the voltage feature value of the second capacitor comprises one or more of the following: the time constant of the second capacitor and a voltage waveform status of the second capacitor; and the voltage waveform status of the first capacitor represents fluctuation trends of voltages at two ends of the first capacitor, and the voltage waveform status of the second capacitor represents fluctuation trends of voltages at two ends of the second capacitor.

16. An insulation resistor detection apparatus, comprising an obtaining unit, a processing unit, a calculation unit, a to-be-detected apparatus, a first capacitor, and a second capacitor, wherein the obtaining unit is configured to obtain a first voltage waveform corresponding to the first capacitor and a second voltage waveform corresponding to the second capacitor, wherein the first capacitor is a capacitor between a positive electrode of a power supply of the to-be-detected apparatus and the ground, and the second capacitor is a capacitor between a negative electrode of the power supply and the ground;

the processing unit is configured to control the first capacitor and the second capacitor to switch between a first state and a second state, wherein the first state is that the first capacitor is charged and the second capacitor discharges electricity, and the second state is that the first capacitor discharges electricity and the second capacitor is charged;

the calculation unit is configured to: calculate, based on the first voltage waveform obtained by the obtaining unit at a current moment, voltage feature values of the first capacitor at different moments in specified duration before the current moment; and calculate, based on the second voltage waveform obtained by the obtaining unit at the current moment, voltage feature values of the second capacitor at different moments in the specified duration before the current moment; and the processing unit is further configured to: determine a next switching moment based on the voltage feature values of the first capacitor that are output by the calculation unit at the different moments or the voltage feature values of the second capacitor that are output by the calculation unit at the different moments; and control, when the next switching moment arrives, the first capacitor and the second capacitor to switch a state.

17. The apparatus according to claim 16, wherein the obtaining unit is further configured to: after the first capacitor and the second capacitor are controlled to switch the state when the next switching moment arrives, continue to obtain the first voltage waveform and the second voltage waveform; and the processing unit is further configured to determine a resistance value of a first resistor based on the first voltage waveform that is continuously obtained by the obtaining unit, and determine a resistance value of a second resistor based on the second voltage waveform that is continuously obtained by the obtaining unit, wherein the first resistor is an insulation resistor between the positive electrode of the power supply and the ground, the second resistor is an insulation resistor between the negative electrode of the power supply and the ground, and the resistance value of the first resistor and the resistance value of the second resistor are used to determine whether the insulation resistors are faulty.

18. The apparatus according to claim 17, wherein the processing unit is further configured to:

compare any two adjacent voltage feature values in the voltage feature values of the first capacitor at the different moments, or compare any two adjacent voltage feature values in the voltage feature values of the second capacitor at the different moments to determine a difference between the any tow adjacent voltage feature values;

when determining that the difference between the any two adjacent voltage feature values is greater than a preset error threshold, determine the current moment as the next switching moment; and when determining that the difference between the any two adjacent voltage feature values is less than or equal to the preset error threshold, determine a time constant of the first capacitor and/or a time constant of the second capacitor, and determine the next switching moment based on the time constant of the first capacitor and/or the time constant of the second capacitor.

19. The apparatus according to claim 18, wherein the processing unit is further configured to:

when determining that the difference between the any two adjacent voltage feature values is less than or equal to the preset error threshold, record a first voltage value that corresponds to the first voltage waveform at each switching moment of the first capacitor and a second voltage value that corresponds to the second voltage waveform at each switching moment of the second capacitor;

when determining that a difference between the any two adjacent voltage feature values is greater than the preset error threshold, delete a first voltage value and a second voltage value that are recorded before the current moment, and re-record a first voltage value that corresponds to the first voltage waveform at each subsequent switching moment of the first capacitor and a second voltage value that corresponds to the second voltage waveform at each subsequent switching moment of the second capacitor; and determine the resistance value of the first resistor by using the recorded first voltage value and the resistance value of the second resistor by using the recorded second voltage value.

20. The apparatus according to claim 17, wherein the processing unit is further configured to:

send a turn-off instruction to the to-be-detected apparatus when determining that the resistance value of the first resistor or the resistance value of the second resistor is less than a first preset insulation threshold, wherein the turn-off instruction is used to instruct the to-be-detected apparatus to disconnect the power supply from a load.

* * * * *